(12) United States Patent
Ueno et al.

(10) Patent No.: US 11,127,616 B2
(45) Date of Patent: Sep. 21, 2021

(54) SUBSTRATE ACCOMMODATION DEVICE

(71) Applicant: NISSIN ION EQUIPMENT CO., LTD., Koka (JP)

(72) Inventors: Koyu Ueno, Koka (JP); Masatoshi Onoda, Koka (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 0 days.

(21) Appl. No.: 16/804,631

(22) Filed: Feb. 28, 2020

(65) Prior Publication Data
US 2020/0286763 A1     Sep. 10, 2020

(30) Foreign Application Priority Data

Mar. 7, 2019  (JP) .............................. JP2019-041285

(51) Int. Cl.
*H01L 21/677*  (2006.01)
*H01L 21/673*  (2006.01)

(52) U.S. Cl.
CPC .... *H01L 21/67745* (2013.01); *H01L 21/6732* (2013.01)

(58) Field of Classification Search
CPC .......... H01L 21/6732; H01L 21/67201; H01L 21/67745; H01L 21/67778; H01L 21/67196; H01L 21/67303; H01L 21/67109

See application file for complete search history.

(56) References Cited

U.S. PATENT DOCUMENTS

| | | | |
|---|---|---|---|
| 2003/0103836 A1* | 6/2003 | Beaulieu | H01L 21/67167 414/217 |
| 2012/0170999 A1 | 7/2012 | Sakaue | |
| 2014/0271054 A1* | 9/2014 | Weaver | H01L 21/67754 414/217.1 |
| 2016/0284577 A1* | 9/2016 | Ishizawa | H01L 21/67745 |
| 2020/0013655 A1* | 1/2020 | Schober | H01L 21/67386 |

FOREIGN PATENT DOCUMENTS

| | | |
|---|---|---|
| JP | 2011-49507 A | 3/2011 |
| KR | 10-2012-0060588 A | 6/2012 |

OTHER PUBLICATIONS

Communication dated Jul. 20, 2020, from the European Patent Office in European Application No. 20160134.1.

* cited by examiner

*Primary Examiner* — Glenn F Myers
(74) *Attorney, Agent, or Firm* — Sughrue Mion, PLLC

(57) ABSTRACT

A substrate accommodation device includes a casing, a gas supply that supplies a gas into the casing, and a transfer structure which retains substrates vertically spaced apart from each other and vertically transfers the substrates first-in-first-out from a carry-in position to a carry-out position within the casing. The gas heats or cools the substrates as the substrates are transferred first-in-first-out from the carry-in position to the carry-out position.

10 Claims, 21 Drawing Sheets

SUBSTRATE ACCOMMODATION DEVICE

CROSS-REFERENCE TO RELATED APPLICATION

This application claims priority from Japanese Patent Application No. 2019-41285, filed in the Japanese Patent Office on Mar. 7, 2019, the entire contents of which is herein incorporated by reference in its entirety.

BACKGROUND

1. Field

The present disclosure relates to a substrate accommodation device used to deliver a substrate between the substrate accommodation device and a vacuum processing chamber.

2. Description of Related Art

In a semiconductor manufacturing process and a flat panel display manufacturing process, various substrates such as a semiconductor wafer and a glass substrate undergo various kinds of processing, for example, ion implantation, in a vacuum processing chamber. In this process, a substrate must be delivered to the vacuum processing chamber without breaking a vacuum state of the vacuum processing chamber.

In some cases, multiple semiconductor wafers may be contained together in a container while being placed in multi-stages, and nitrogen gas or the like may be used as a cooling gas to restore an interior of the container from the vacuum state to an atmospheric pressure state and, the semiconductor wafers may be cooled.

Thus, the semiconductor wafers that are accommodated in the container may be collectively cooled before being transferred out to an exterior of the vacuum processing chamber, and then additional semiconductor wafers may be accommodated in the container, with this process being repeated.

Thus, there is generated a standby time for collectively cooling the semiconductor wafers each time the semiconductor substrates are accommodated in the container, resulting in a problem of a reduction in throughput. Further, also in the case where a plurality of semiconductor wafers are to be heated, the plurality of semiconductor wafers are similarly collectively heated, so that a similar standby time is generated, resulting in a reduction in throughput.

SUMMARY

It is an aspect to provide a substrate accommodation device capable of cooling or heating a substrate in a casing while achieving an increase in throughput.

According to an aspect of one or more embodiments, there is provided a substrate accommodation device comprising a casing that accommodates a plurality of substrates; a temperature varying means for varying a temperature of the substrates accommodated in the casing; and a transfer structure which retains the plurality of substrates accommodated in the casing in a state in which the substrates are spaced apart from each other at a predetermined interval and which, within the casing, transfers the substrates from a carry-in position at which the substrates are transferred into the casing from an outside of the casing to a carry-out position from which the substrates are transferred to the outside of the casing, wherein the transfer structure is configured such that, as substrates are newly accommodated in the casing, substrates previously accommodated in the casing are successively transferred to the carry-out position.

According to another aspect of one or more embodiments, there is provided a substrate accommodation device comprising a casing that accommodates a plurality of substrates; a gas supply that supplies a gas having a temperature into the casing to heat or cool the substrates; and a transfer structure which retains the plurality of substrates accommodated in the casing in a state in which the substrates are spaced apart from each other at a predetermined interval and which, within the casing, transfers each substrate of the plurality of substrates from a carry-in position at which the substrate is transferred into the casing from an outside of the casing to a carry-out position from which the substrate is transferred to the outside of the casing, wherein the transfer structure is configured such that, as a new substrate is transferred into the casing, substrates previously accommodated in the casing are successively transferred to the carry-out position.

According to another aspect of one or more embodiments, there is provided a substrate accommodation device comprising a casing; a gas supply that supplies a gas into the casing; and a transfer structure which retains plurality of substrates vertically spaced apart from each other and vertically transfers the plurality of substrates first-in-first-out from a carry-in position to a carry-out position within the casing, wherein the substrates are transferred from an outside the casing to the carry-in position through a first side of the casing, and transferred from the casing to the outside of the casing through a second side of the casing opposite to the first side, and wherein the gas heats or cools the substrates as the substrates are transferred first-in-first-out from the carry-in position to the carry-out position

BRIEF DESCRIPTION OF THE DRAWINGS

The above and/or other aspects will become apparent and more readily appreciated from the following description of embodiments, taken in conjunction with the accompanying drawings, of which:

FIG. 8 is a schematic diagram illustrating another modification of the support portion of the substrate accommodation device of FIG. 1, according to an embodiment;

DETAILED DESCRIPTION

Figure 1:
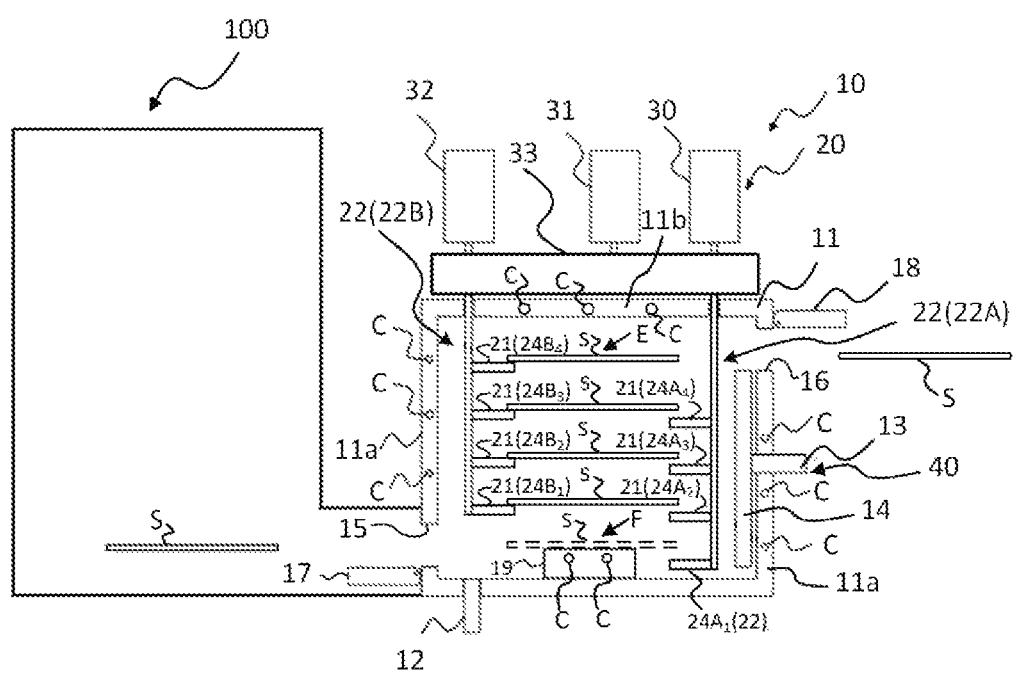
FIG. 1 is a schematic view of the structure of a substrate accommodation device according to an embodiment.

In a semiconductor manufacturing process and a flat panel display manufacturing process, various substrates such as a semiconductor wafer and a glass substrate undergo various kinds of processing, for example, ion implantation, in a vacuum processing chamber. In some cases, in this process, there is employed a substrate accommodation device capable of performing delivery of a substrate between the substrate accommodation device and the vacuum processing chamber and capable of accommodating a plurality of substrates without breaking the vacuum state of the vacuum processing chamber.

The substrate accommodation device may be, for example, a load lock device.

Japanese Patent Laid-Open No. 2011-49507 describes an example of a load lock device that is used to cool a high temperature wafer, and is equipped with a container in which four semiconductor wafers may be accommodated while placed in multi-stages. By utilizing nitrogen gas or the like for restoring the interior of the container from the vacuum state to the atmospheric pressure state as the cooling gas, the accommodated semiconductor wafers are cooled.

In the load lock device, four semiconductor wafers may be accommodated in the container and may be collectively cooled before being carried out to the exterior, and then a next four semiconductor wafers may be accommodated in the container, with this process being repeated.

Thus, there is generated a standby time for collectively cooling the four substrates each time the four substrates are accommodated in the container, resulting in a disadvantage of a reduction in throughput. Further, also in the case where a plurality of substrates are to be heated, the plurality of substrates are collectively heated, so that a similar standby time is generated, resulting in a reduction in throughput.

It is an aspect of the present disclosure to provide a substrate accommodation device capable of cooling or heating a substrate in a casing and of achieving an increase in throughput.

According to various embodiments described herein, a substrate accommodation device may include a casing accommodating a plurality of substrates in an internally evacuated state; a temperature varying means varying the temperature of the substrates accommodated in the casing; and a transfer structure which retains the plurality of substrates accommodated in the casing in a state in which the plurality of substrates are spaced away from each other at a predetermined interval and which, within the casing, transfers the substrates from a carry-in position at which the substrates are carried in from the outside of the casing to a carry-out position for carrying out the substrates to the outside of the casing, wherein the transfer structure is configured such that, as the substrates are newly accommodated in the casing, the substrates previously accommodated in the casing successively reach the carry-out position.

The temperature varying means may vary the temperature of the substrates accommodated in the casing, so that it is possible to cool or heat the substrates accommodated in the casing.

The transfer structure may transfer the substrates such that as the substrates are newly accommodated in the casing, the substrates previously accommodated in the casing successively reach the carry-out position, so that as substrates are newly accommodated in the casing, the substrates accommodated previously in the casing may be successively carried out to the outside of the casing.

Thus, it is possible to secure a cooling time or a heating time between the moment that the substrate is accommodated in the casing and the moment that the substrate reaches the carry-out position to be carried out to the outside of the casing, and it is possible to successively carry out the substrates from the casing each time substrates are newly carried into the casing.

As compared with the related art technique, there is no need to provide a standby time for collectively cooling or heating a plurality of substrates, and it is possible to carry out the cooled or heated substrates to the outside as high temperature substrates are newly accommodated in the casing.

Further, it is possible to provide an exhaust mean for evacuating the casing, and a gas supply means for introducing a gas into the casing, with the gas supply means functioning as the abovementioned temperature varying means.

The above-described structure is equipped with an exhaust means evacuating the casing, and a gas supply means introducing a gas into the casing, so that it is possible to use the substrate accommodation device according to various embodiments as a load lock device capable of restoring the substrates to the atmospheric pressure state without breaking the vacuum state of the vacuum processing chamber.

Further, the gas supply means functions as a temperature varying means. That is, a gas at a lower or a higher temperature than the substrates accommodated in the casing may be introduced by the gas supply means, whereby it is possible to cool or heat the substrates.

Thus, in the case where restoration to the atmospheric pressure is to be effected by introducing a gas such as an inert gas such as nitrogen gas into the casing by using the gas supply means, the gas introduced is set to a temperature lower or higher than that of the substrates accommodated in the casing, whereby it is possible to cool or heat the substrates.

Further, the transfer structure may simultaneously transfer the plurality of substrates in the casing by driving a retaining body having a plurality of retaining portions respectively retaining the plurality of substrates.

In the above-described structure, it is possible to simultaneously transfer a plurality of substrates accommodated within the casing by driving the retaining body.

Further, the retaining body may be formed by a first retaining body and a second retaining body driven independently, and transfer the substrates within the casing while simultaneously repeating the operation of delivering each of the plurality of substrates between a first retaining portion which is the retaining portion of the first retaining body and a second retaining portion which is the retaining portion of the second retaining body by respectively driving the first retaining body and the second retaining body.

Due to the above-described structure, it is possible to transfer the substrates within the casing while simultaneously repeating the operation of delivering a plurality of substrates, so that it is possible to shorten the requisite time for the transfer as compared with the case where a plurality of substrates are transferred one by one within the casing.

Further, the substrate accommodation device may respectively have a plurality of first retaining bodies and a plurality of second retaining bodies, and the plurality of first retaining bodies and the plurality of second retaining bodies may be respectively driven so as to perform identical operation in conjunction with each other.

Due to the above-described structure, even in the case where the retaining body is formed by using a plurality of first retaining bodies and a plurality of second retaining bodies, the plurality of first retaining bodies and the plurality of second retaining bodies respectively perform identical operation in conjunction with each other, whereby it is possible to simultaneously perform the delivery of a plurality of substrates between the first retaining body and the second retaining body.

In the substrate accommodation device according to various embodiments disclosed herein, it is possible to cool or heat a substrate within the casing, and to achieve an increase in throughput.

Various embodiments will now be described with reference to the accompanying figures.

FIG. 1 is a schematic view of the structure of a substrate accommodation device according to an embodiment.

As shown in FIG. 1, a substrate accommodation device 10 may be equipped with a casing 11 accommodating a plurality of substrates S, which may be semiconductor wafers, glass substrates or the like, in an internally evacuated state, and a temperature varying means 40 that varies the temperature of the substrates S accommodated in the casing 11. For example, in some embodiments, the temperature varying means 40 may include a gas supply that supplies gas of a certain temperature into the casing 11 in order to cause a change to the temperature inside the casing 11, thus changing the temperature of the substrates S accommodated therein. In other embodiments, the temperature varying means 40 may include, additionally or alternatively to the gas supply, a heater or refrigeration device to cause a change to the temperature in the casing 11, thus changing the temperature of the substrates S accommodated therein.

Further, the substrate accommodation device 10 may include a transfer structure 20 which horizontally retains the plurality of substrates S accommodated in the casing 11 in a state in which they are spaced apart from each other at a predetermined interval in the height direction of the casing 11, and which, within the casing 11, transfers the substrates S from a carry-in position F for transferring the substrates S from the outside of the casing 11 to the inside of the casing 11, to a carry-out position E for transferring the substrates S from the inside of the casing 11 to the outside of the casing 11.

Further, as shown in FIG. 1, the substrate accommodation device 10 may be equipped with an exhaust means 12 that evacuates the interior of the casing 11 to create a vacuum state therein, and a gas supply means 13 that introduces a gas such as an inert gas such as nitrogen gas into the casing 11. For example, in some embodiments, the exhaust means 12 may include a vacuum pump, one or more valves, and an exhaust port in communication with the interior of the casing 11 that operate to create a vacuum condition within the casing 11. In some embodiments, the gas supply means 13 may include a gas pump, one or more valves, and a gas supply port in communication with the interior of the casing 11 that operate to introduce a gas into the casing 11. In other embodiments, the gas supply means may include the gas supply port and a gas canister having gas under pressure for injection into the casing 11 through the gas supply port. In some embodiments, the substrate accommodation device 10 may be arranged adjacent to a vacuum processing chamber 100 that performs processing such as ion implantation on the substrates S in the vacuum state.

That is, the substrate accommodation device 10 may function as a load lock device that is capable of accommodating a plurality of substrates S without breaking the vacuum state of the vacuum processing chamber 100, and that is capable of restoring the substrates S to an atmospheric pressure state.

Further, as described below, in some embodiments, the gas supply means 13 may be configured as a temperature varying means 40. More specifically, the gas supply means 13 may introduce a gas at a lower temperature or a higher temperature than the substrates S accommodated in the casing 11 to cool or heat the substrates S, respectively, thereby functioning as the temperature varying means 40.

Note that, in the case where the substrate accommodation device 10 is configured as a load lock device, the gas introduced may also serve as an atmospheric pressure restoring gas for enhancing the internal pressure of the casing 11 and restoring the substrates S accommodated in the casing 11 to the atmospheric pressure state.

Further, as shown in FIG. 1, in some embodiments, the gas supply means 13 may have a diffusion filter 14 inside the casing 11 that diffuses the gas that is introduced into the casing 11, so that the introduced gas may be caused to flow uniformly between the plurality of substrates S accommodated in the casing 11.

In two opposite side surface portions 11a of the casing 11, there are respectively formed a carry-in portion 15 which is an opening for transferring the substrates S from the vacuum processing chamber 100 into the substrate accommodation device 10, and a carry-out portion 16 which is an opening for transferring the substrates S from the substrate accommodation device 10 to an exterior of the substrate accommodation device 10.

The carry-in portion 15 and the carry-out portion 16 may be formed at substantially the same positions in the height direction as the carry-in position F and the carry-out position E, respectively, in order to facilitate the carrying-in and carrying-out of the substrates S. In the embodiment of FIG. 1, in conformity with the conveyance of the substrates S within the casing 11 from the lower side to the upper side, the carry-in portion 15 and the carry-out portion 16 are respectively formed at the lower portion and the upper portion, respectively of the side surface portions 11a.

The carry-in portion 15 and the carry-out portion 16 are respectively provided with a carry-in gate 17 and a carry-out gate 18 that open and close the respective openings of the carry-in portion 15 and the carry-out portion 16. In the state in which the carry-in gate 17 and the carry-out gate 18 are closed, the casing 11 is closed in an internally airtight fashion.

Further, on the bottom surface of the interior of the casing 11, there is arranged a stand 19 on which the substrate S transferred into the casing 11 is first placed.

The substrate S undergoes processing such as ion implantation in the vacuum processing chamber 100, and then passes from the vacuum processing chamber 100 to the carry-in portion 15 in the state in which the carry-in gate 17 is opened by using a robot hand (not shown) or the like, and is then carried into the casing 11, the interior of which is placed in the vacuum state, to be placed on the stand 19. After the carry-in gate 17 is closed, an inert gas such as nitrogen gas is introduced into the casing 11 by the gas supply means 13, and the air pressure inside the casing 11 is increased, whereby the substrate S may be restored to the atmospheric pressure state.

The substrate accommodation device 10 may be used for both cooling and heating of the substrates S by varying the kind and temperature of the gas introduced into the casing 11 by the gas supply means 13. In the following description, a case will be assumed and described in which the substrates S that have been heated to high temperature are cooled in the substrate accommodation device 10. However, this is only an example, and as described above, in other embodiments, substrates that have been cooled to a low temperature may be heated in the substrate accommodation device 10.

As shown in FIG. 1, a flow path C for passing a refrigerant such as cooling water is provided in the interior of the side surface portion 11a, the interior of the top surface portion 11b, and the interior of the stand 19 of the casing 11.

As shown in FIG. 1, the substrate accommodation device 10 horizontally retains a plurality of substrates S (for example, four in the example illustrated in FIG. 1) accommodated in the casing 11 in a state in which the substrates S are spaced apart from each other at a predetermined interval in the height (i.e., vertical) direction, and is equipped with a transfer structure 20 that transfers the substrates S within the casing 11 from the carry-in position F to the carry-out position E.

Here, the carry-in position F designates a position of the substrate S in the state in which the substrate S is placed on the stand 19. Further, the carry-out position E designates a position at which the substrate S is retained immediately before being transferred out from the carry-out gate 18. More specifically, the carry-out position E designates a position at which the substrate S is supported by three second support members $24B_4$ of a second retaining body 22B described below.

As shown in FIG. 1, the transfer structure 20 of the substrate accommodation device 10 may be a structure which, while the substrates S are accommodated in the casing 11, moves the substrates S accommodated in the casing 11 stepwise upwards to transfer the substrates S such that the substrates S reach the carry-out position E in the order in which the substrates S are previously accommodated in the casing 11. In other words, the transfer structure 20 implements a first in first out (FIFO) system.

As shown in FIG. 1, the transfer structure 20 may be include a plurality of retaining bodies 22 each having a plurality of retaining portions 21 retaining the substrates S, and a plurality of drive sources 30, 31, and 32 arranged outside the casing 11.

Further, between the retaining bodies 22 and the plurality of drive sources 30, 31, and 32, there exists a drive force transmission mechanism 33, and the drive force generated from the drive sources 30, 31, and 32 is transmitted directly or indirectly to each retaining body 22 via the drive force transmission mechanism 33, whereby each retaining body 22 is driven.

Note that each of the drive sources 30, 31, and 32 may be an actuator.

That is, by driving the drive sources 30, 31, and 32 through external control, the transfer structure 20 operates each retaining body 22, and transfers the substrate S within the casing 11 from the carry-in position F to the carry-out position E, and the substrate S having reached the carry-out position E is then transferred out to the exterior of the casing 11 from the carry-out portion 16 by a robot hand (not shown) or the like.

Note that, to facilitate understanding, FIG. 1 and FIGS. 4 through 6 only show two retaining bodies 22 (i.e., retaining bodies 22A and 22B). However, in an actual implementation, there may be arranged six retaining bodies 22 (22A), 22 (22A), 22 (22A), 22 (22B), 22 (22B), and 22 (22B) in the casing 11, as illustrated in FIG. 2.

Figure 2:
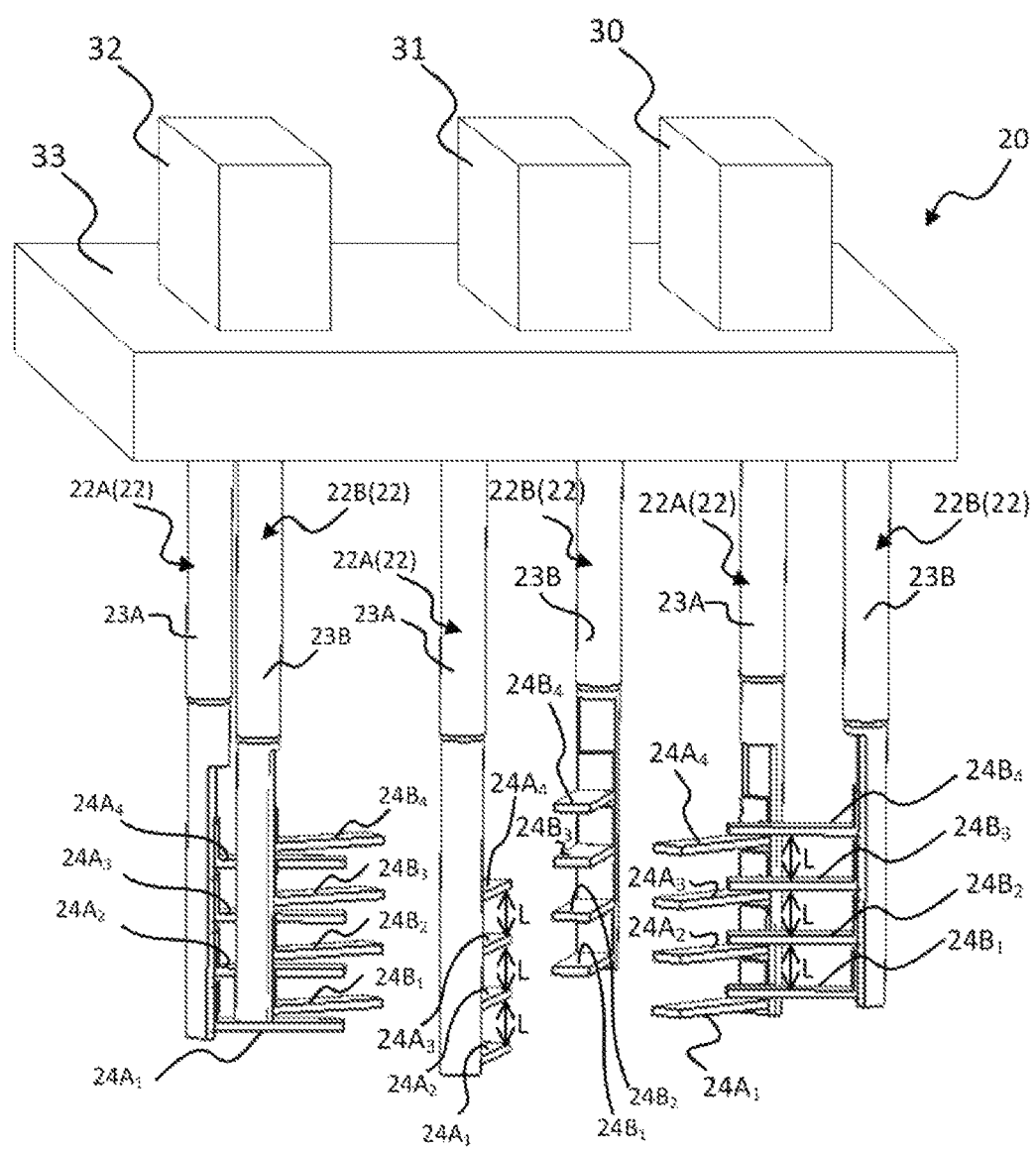
FIG. 2 is a perspective view of a transfer structure of the substrate accommodation device of FIG. 1, according to an embodiment.

FIG. 2 is a perspective view of the transfer structure of the substrate accommodation device of FIG. 1, according to an embodiment.

As shown in FIG. 2, the transfer structure 20 may include six retaining bodies 22. The six retaining bodies 22 may include three first retaining bodies 22A and three second retaining bodies 22B.

Figure 3:
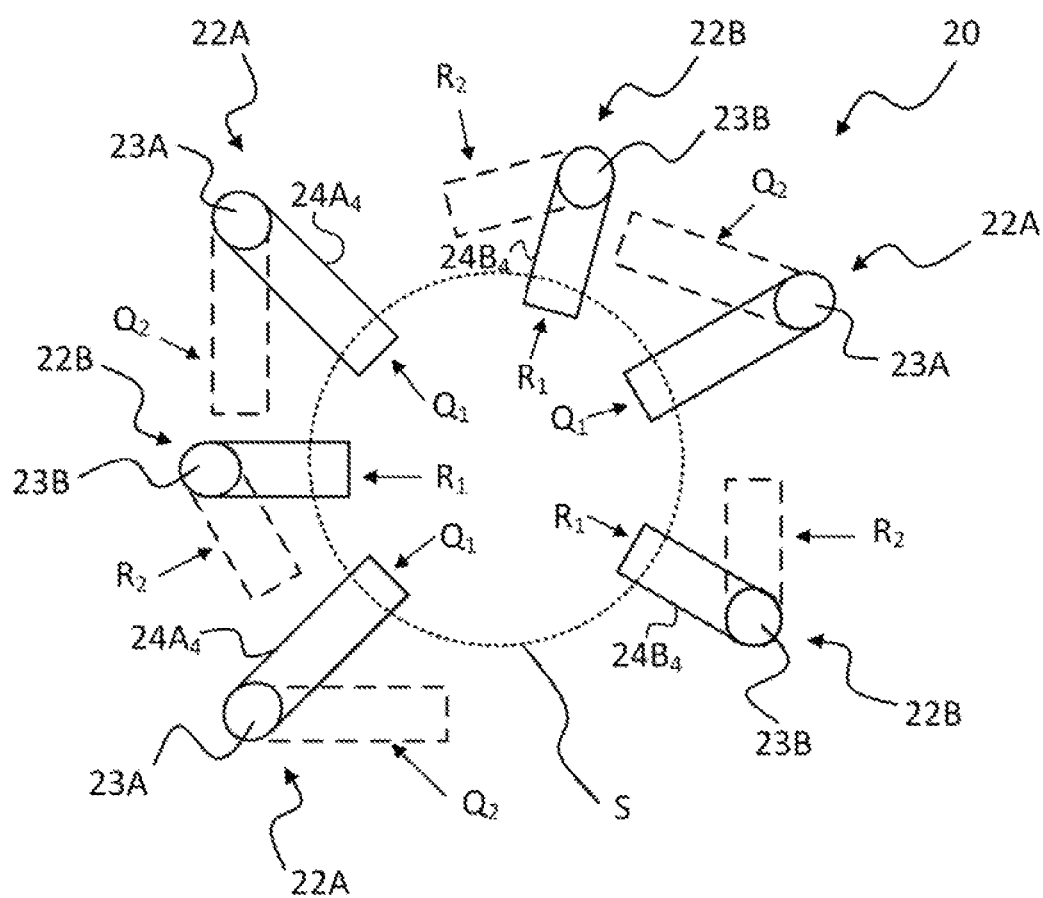
FIG. 3 is a schematic diagram illustrating a rotational operation of the transfer structure of FIG. 2, according to an embodiment.

As shown in FIG. 2 and FIG. 3, the three first retaining bodies 22A and the three second retaining bodies 22B may be alternately arranged so as to surround the outer periphery of the substrate S accommodated in the casing 11 (best seen in FIG. 3).

Further, as shown in FIG. 2, the first retaining bodies 22A each may have a shaft portion 23A directly or indirectly connected to the drive source 30 and the drive source 31 via the drive force transmission mechanism 33. The second retaining bodies 22B each may have a shaft portion 23B directly or indirectly connected to the drive source 32 via the drive force transmission mechanism 33.

Here, each of the three first retaining bodies 22A may perform the same conjoint operation by a link mechanism (not shown) or a timing belt mechanism (not shown) formed in the drive force transmission mechanism 33.

More specifically, each of the three first retaining bodies 22A receives the drive force of the drive source 30 via the drive force transmission mechanism 33, thereby performing the same vertical movement inside the casing 11.

Figure 4A:
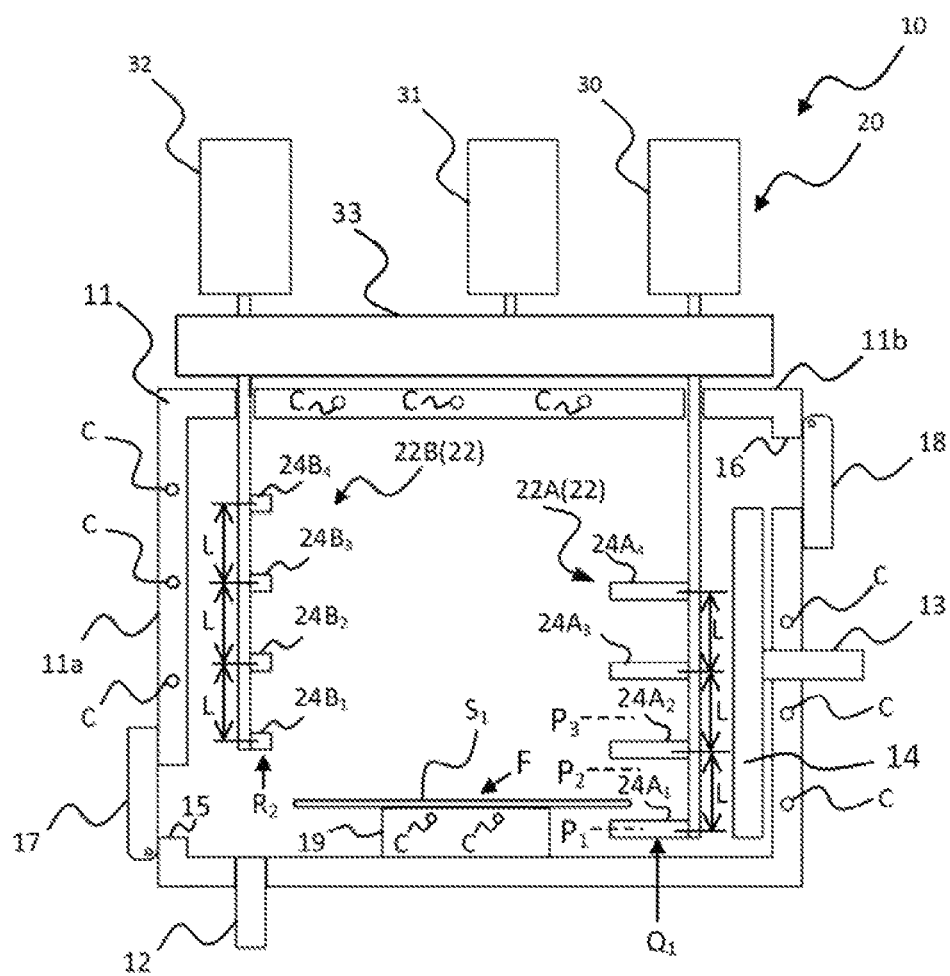
FIGS. 4A-4D are schematic diagrams illustrating a first delivery operation of the substrate accommodation device of FIG. 1, according to an embodiment.

The vertical movement of each of the three first retaining body 22A denotes ascent and descent among an initial position P1, an intermediate position P2, and a highest position P3 of the first retaining body 22A as shown in FIG. 4A described below.

Further, as shown in FIG. 3, each of the three first retaining bodies 22A receives the drive force of the drive source 31 via the drive force transmission mechanism 33 to thereby perform the same rotational movement around the shaft portion 23A.

As shown in FIG. 3, the rotational movement of the three first retaining bodies 22A is performed such that first support members $24A_1$ through $24A_4$ described below reciprocate between a support position Q1 and a retracted position Q2.

Similarly, each of the three second retaining bodies 22B performs the same conjoint operation by a link mechanism (not shown) or a timing mechanism (not shown) formed in the drive force transmission mechanism 33.

More specifically, each of the second retaining bodies 22B receives the drive force of the drive source 32 via the drive force transmission mechanism 33, thereby performing the same rotational movement around the shaft portion 23B.

As shown in FIG. 3, the rotational movement of the three second retaining bodies 22B is performed such that second support members $24B_1$ through $24B_4$ of the second retaining bodies 22B described below reciprocate between a support position R1 and a retracted position R2.

As shown in FIG. 2, the shaft portion 23A of each of the first retaining bodies 22A is equipped with four flat-plate like first support members $24A_1$ through $24A_4$ arranged successively from lowest position to highest position so as to be uniformly spaced apart from each other by a predetermined interval L in an axial direction. Each of the first support members $24A_1$ through $24A_4$ is capable of supporting the outer edge portion of a back surface of a substrate S. The first support members $24A_1$ through $24A_4$ correspond to the retaining portions 21 of the first retaining body 22A.

Similarly, the shaft portion 23B of each of the second retaining bodies 22B is equipped with four flat-plate like second support members $24B_1$ through $24B_4$ arranged successively from lowest position to highest position so as to be uniformly spaced apart from each other by the predetermined interval L in the axial direction and each is capable of supporting the outer edge portion of the back surface of a substrate S. The second support members $24B_1$ through $24B_4$ correspond to the retaining portions 21 of the second retaining body 22B.

As shown in FIG. 2, the three first support members $24A_1$ of the three first retaining bodies 22A are arranged at a same position with respect to the height direction within the casing 11.

Further, since each of the first support members $24A_1$ through $24A_4$ are arranged so as to be spaced apart from each other by the predetermined interval L, the other three support members $24A_2$, other three support members $24A_3$ and other three support members $24A_4$ are similarly arranged at the same positions with respect to the height direction within the casing 11. That is, the three support members $24A_2$ are arranged at the same height position, the three support members $24A_3$ are arranged at the same height position, and the three support members $24A_4$ are arranged at the same height position.

Thus, the first support members $24A_1$ through $24A_4$ may support the substrate S horizontally at any position within the casing 11. That is, the substrates S may be horizontally supported at the respective positions by the three first support members $24A_1$, three first support members $24A_2$, three first support members $24A_3$ and three first support members $24A_4$.

The second support members $24B_1$ through $24B_4$ are similarly arranged as the first support members $24A_1$ through $24A_4$. As shown in FIG. 2, the three support members $24B_1$ are arranged at the same position with respect to the height direction within the casing 11.

Further, since each of the second support members $24B_1$ through $24B_4$ are arranged so as to be spaced away from each other by the predetermined interval L, the other three support members $24B_2$, the other three support members $24B_3$ and the other three support members $24B_4$ are also arranged at the same positions respectively with respect to the height direction within the casing 11. That is, the three support members $24B_2$ are arranged at the same height position, the three support members $24B_3$ are arranged at the same height position, and the three support members $24B_4$ are arranged at the same height position.

Thus, the second support members $24B_1$ through $24B_4$ may support the substrate S horizontally at any position within the casing 11. That is, the substrates S may be horizontally supported at the respective positions by the three second support members $24B_1$, three second support members $24B_2$, three second support members $24B_3$ and three second support members $24B_4$.

Further, as shown in FIG. 3, the three first retaining bodies 22A and the three second retaining bodies 22B are arranged alternately around the outer periphery of the substrate S such that the shaft portions 23A and the shaft portions 23B surround the outer periphery of the substrate S accommodated in the casing 11, and the positions of the first support members $24A_1$ through $24A_4$ and the second support members $24B_1$ through $24B_4$ indicated by the solid lines of FIG. 3 are respectively the support positions Q1 of the first retaining bodies 22A and the support positions R1 of the second retaining bodies 22B.

The positions of the first support members $24A_1$ through $24A_4$ and of the second support members $24B_1$ through $24B_4$ indicated by the dashed lines of FIG. 3 are respectively the retracted positions Q2 of the first retaining bodies 22A and the retracted positions R2 of the second retaining bodies 22B.

That is, the support positions Q1 of the first retaining bodies 22A are a position where the first support members $24A_1$ through $24A_4$ may support the outer edge portion of the back surface of the substrate S accommodated in the casing 11, and the retracted positions Q2 of the first retaining bodies 22A are a position where, in plan view, the first support members $24A_1$ through $24A_4$ do not overlap the substrate S.

By setting the first retaining bodies 22A at this retracted position Q2, it is possible to prevent interference of the first support members $24A_1$ through $24A_4$ with the substrate S supported by the second retaining bodies 22B during the descent operation of the first retaining bodies 22A described below.

Further, the support positions R1 of the second retaining bodies 22B are a position where the second support members $24B_1$ through $24B_4$ may support the outer edge portion of the back surface of the substrate S accommodated in the casing 11, and the retracted positions R2 of the second retaining bodies 22B are a position where, in plan view, the second support members $24B_1$ through $24B_4$ do not overlap the substrate S.

By setting the second retaining bodies 22B at this retracted position R2, it is possible to prevent interference of the second support members $24B_1$ through $24B_4$ with the substrate S supported by the first retaining bodies 22A during the ascent operation of the first retaining bodies 22A described below.

Next, an operation of the transfer structure 20, and the substrate S delivery operation by the transfer structure 20 will be described.

FIGS. 4A-4D are schematic diagrams illustrating a first delivery operation of the substrate accommodation device of FIG. 1, according to an embodiment.

First, an operation of delivering a first substrate S1 first transferred into the casing 11 from the first retaining body 22A to the second retaining body 22B and is supported, will be described.

Note that, to facilitate the understanding, in FIGS. 4A-4D and FIGS. 5A-5I, of the six retaining bodies 22, there are illustrated only one each of the first retaining body 22A and the second retaining body 22B for conciseness and clarity of description. However, in an actual implementation, the three first retaining bodies 22A shown in FIG. 2 perform the same operation and the three second retaining bodies 22B shown in FIG. 2 perform the same operation.

First, as shown in FIG. 4A, a first substrate S1 having undergone processing in the vacuum processing chamber 100 is placed on the stand 19. The first retaining body 22A is at the support position Q1, and the second retaining body 22B is at the retracted position R2. This state will be referred to as an initial state.

At this time, of the first support members $24A_1$ through $24A_4$ of the first retaining body 22A, the first support member $24A_1$ arranged lowermost is situated lower than the substrate S1 in the height direction. From this point onward, as shown in FIG. 4A, the position of the first retaining body 22A in the height direction in this initial state will be referred to as the initial position P1 of the first retaining body 22A.

Note that, in FIGS. 4A-4D and FIGS. 5A-5I, in order to indicate the initial position P1 of the first retaining body 22A, an intermediate position P2 and an uppermost position P3 described below, position in the height direction of the first support member $24A_1$ at each position is indicated by a dashed line.

In other words, the dashed lines of FIGS. 4A-4D and FIGS. 5A-5I respectively indicate the position in the height direction of the first support member $24A_1$ when the first retaining body 22A is at the initial position P1, the intermediate position P2, and the uppermost position P3.

As shown in FIG. 4A, at the initial position P1 of the first retaining body 22A, the first support member $24A_2$ arranged at the second position P2 is situated lower in the height direction than the second support member $24B_1$, arranged lowermost, of the second support members $24B_1$ through $24B_4$ of the second retaining body 22B.

Note that the position where the substrate S1 is placed on the stand 19 is the carry-in position F of the substrate S1.

First, in the initial state shown in FIG. 4A, the drive source 30 is driven to raise the first retaining body 22A, and the first support member $24A_1$ supports the back surface of the substrate S1 so as to scoop the substrate S1 up. Then, the first retaining body 22A is raised until the back surface of the substrate S1 is situated at a position slightly higher than the second support member $24B_1$, as shown in FIG. 4B.

Figure 4B:
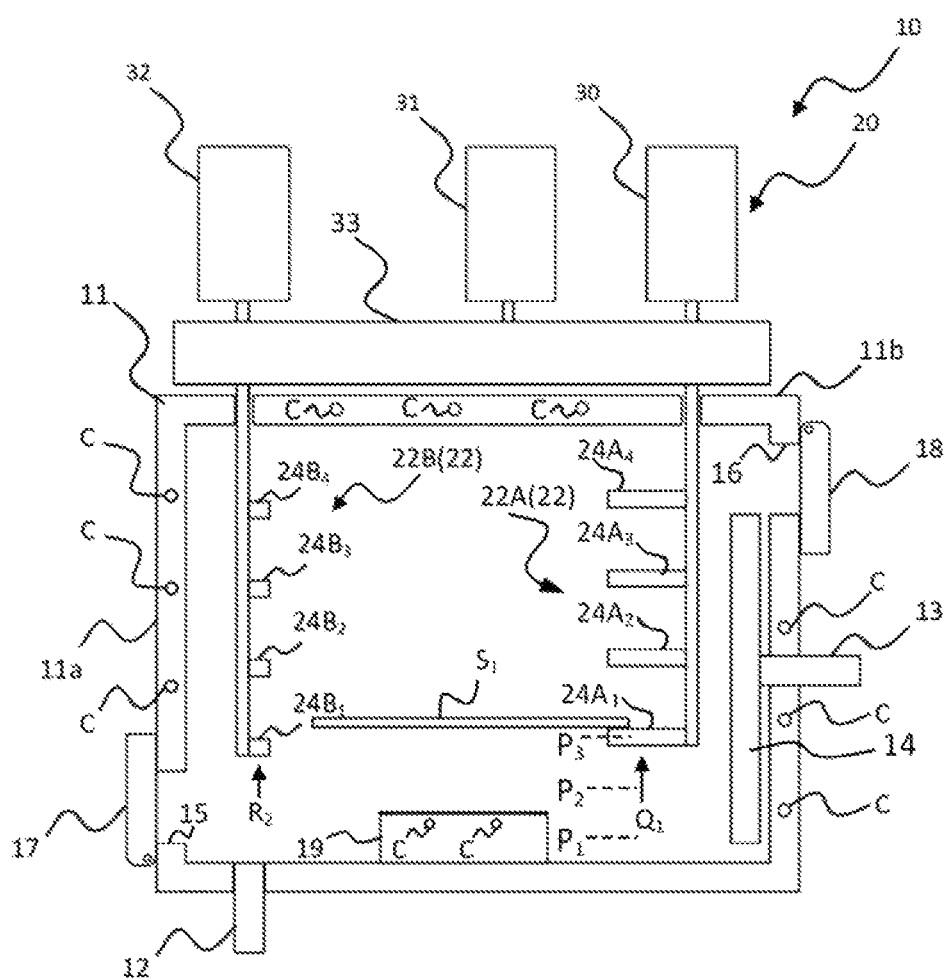

The position in the height direction of the first retaining body 22A shown in FIG. 4B is the uppermost position P3 of the first retaining body 22A.

Figure 4C:
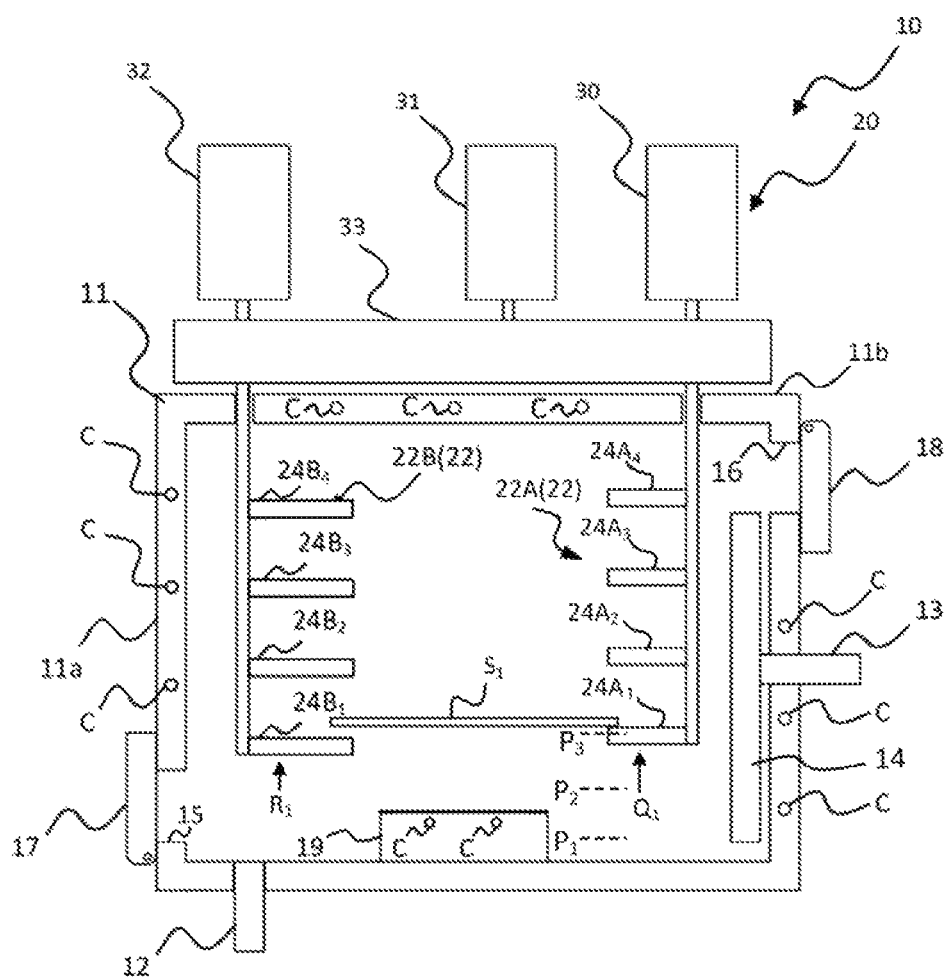

Next, as shown in FIG. 4C, the drive source 32 is driven to set the second retaining body 22B to the support position R1. After this, as shown in FIG. 4D, the drive source 30 is driven to lower the first retaining body 22A to the initial position P1.

In the process of lowering the first retaining body 22A to the initial position P1, with the descent of the first retaining body 22A, the substrate S1 also descends. However, since the second retaining body 22B is at the support position R1, the substrate S1 is picked up by the second support member $24B_1$ of the lowermost layer of the second retaining body 22B halfway through the descent of the first retaining body 22A. Thus, the substrate S1 is delivered from the first retaining body 22A to the second retaining body 22B.

Figure 4D:
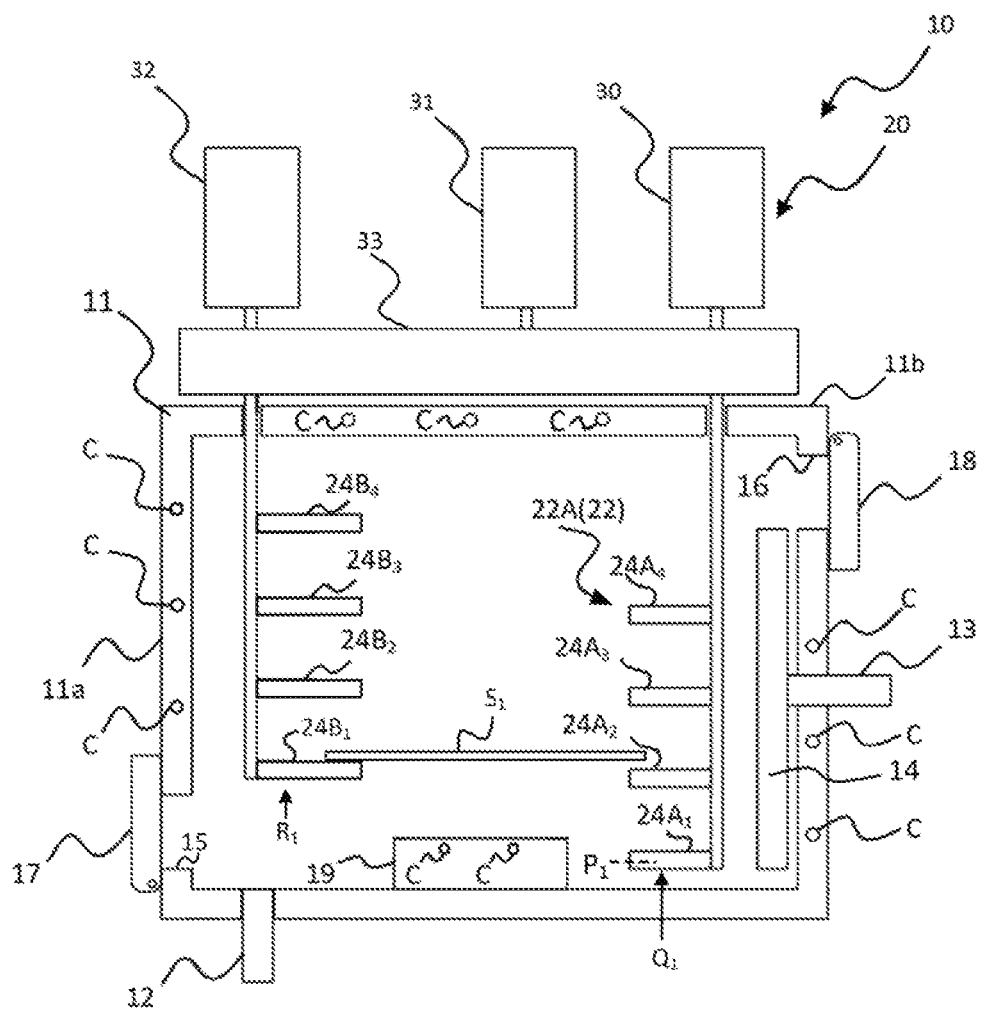

At this time, as shown in FIG. 4D, the first support member $24A_2$ of the first retaining body 22A is situated lower than the back surface of the substrate S1.

In this way, the first substrate S1 first carried into the casing 11 is delivered from the first retaining body 22A to the second retaining body 22B.

The series of operations of the first retaining body 22A and the second retaining body 22B until this first substrate S1 is supported by the second support member $24B_1$ of the second retaining body 22B will be referred to a first delivery operation W1.

That is, the first delivery operation W1 is the series of operations of, after transferring the first substrate S1 into the casing 11 and placing the first substrate S1 on the stand 19:

(Operation 1-1) raising the first retaining body 22A to the uppermost position P3 by the drive source 30;

(Operation 1-2) rotating the second retaining body 22B to the support position R1 by the drive source 32; and (Operation 1-3) lowering the first retaining body 22A to the initial position P1 by the drive source 30.

Next, an operation of delivering a second substrate S2 transferred into the casing 11 second from the first retaining body 22A to the second retaining body 22B and is supported, will be described.

Figure 5A:
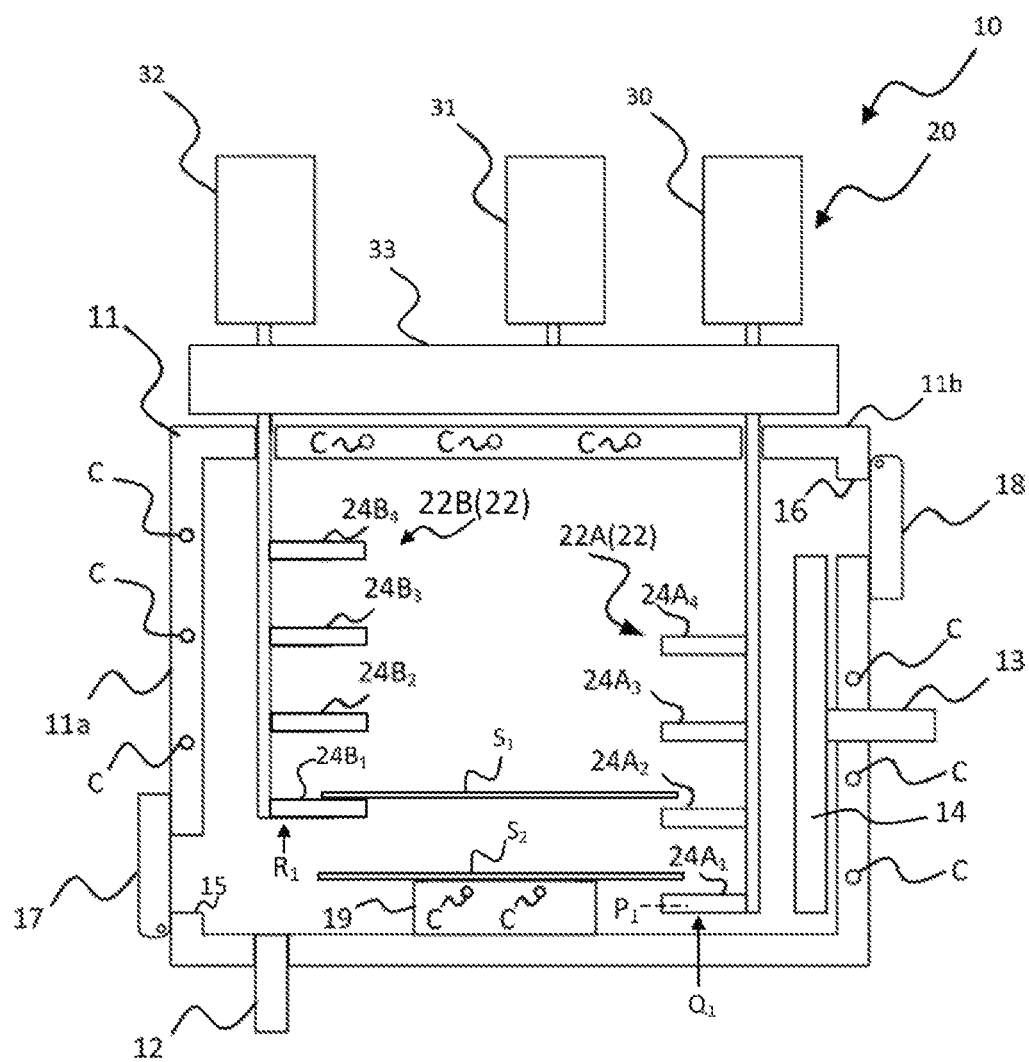
FIGS. 5A-5I are schematic diagrams illustrating a second delivery operation of the substrate accommodation device of FIG. 1, according to an embodiment.

After performing the first delivery operation W1, the second substrate S2 is placed on the stand 19 as shown in FIG. 5A. After this, as shown in FIG. 5B, while raising the first retaining body 22A through the driving of the drive source 30, the first support member $24A_1$ scoops up the substrate S2 and supports the substrate S2, and then the first retaining body 22A is raised until the surface of the substrate S2 is situated at a position slightly lower than the second support member $24B_1$.

Figure 5B:
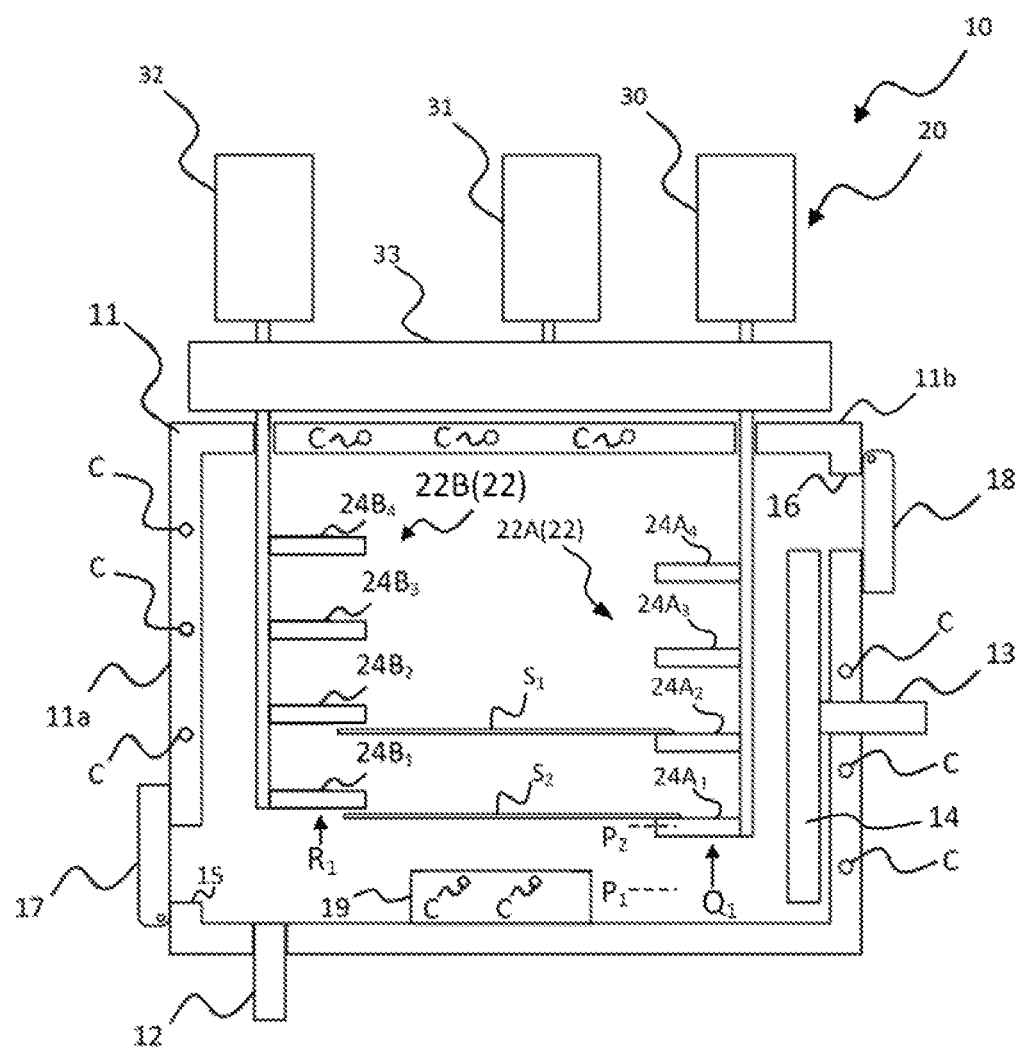

The position in the height direction of the first retaining body 22A shown in FIG. 5B is the intermediate position P2 of the first retaining body 22A.

At this time, the interval between the first support member $24A_1$ and the first support member $24A_2$ and the interval between the second support member $24B_1$ and the second support member $24B_2$ are of the same value, interval L, so that the surface of the substrate S1 is situated at a position slightly lower than the second support member $24B_2$.

Figure 5C:
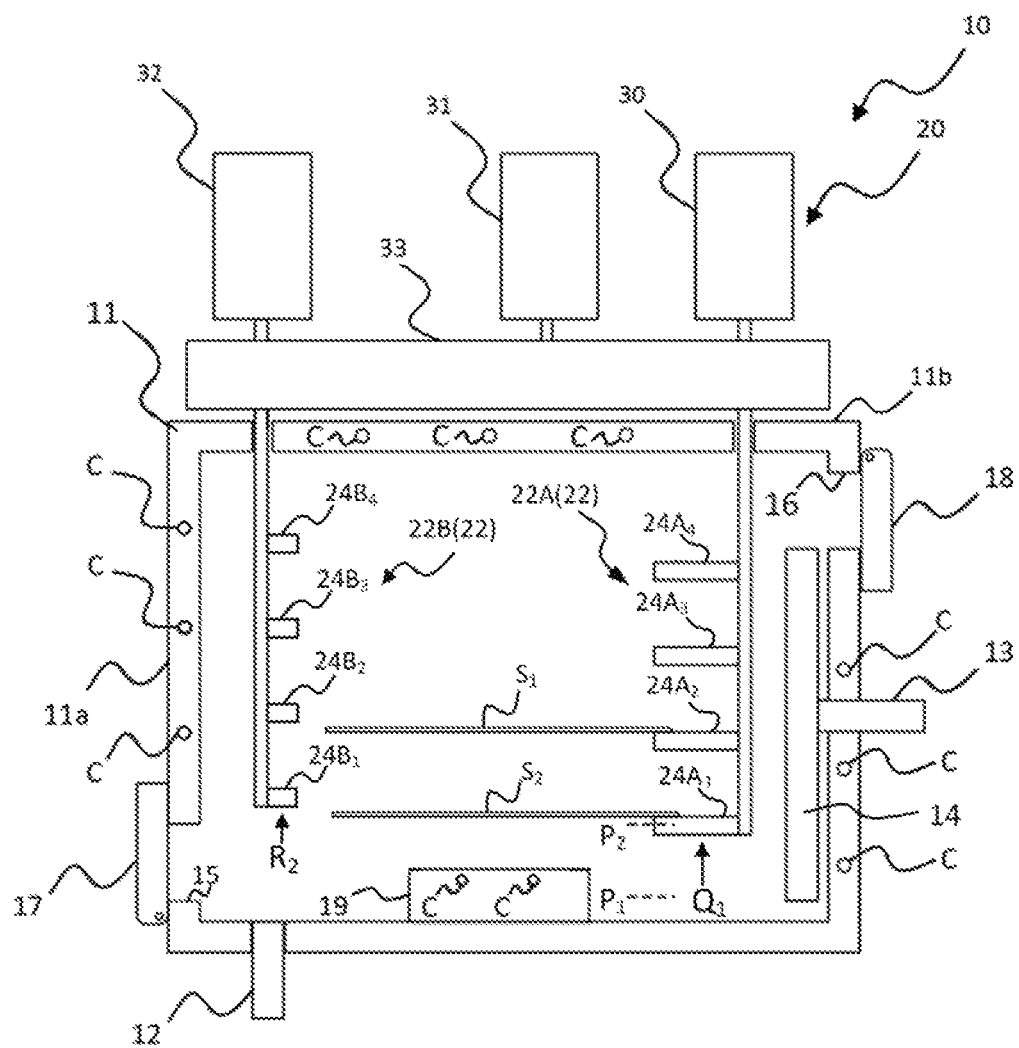
Figure 5D:
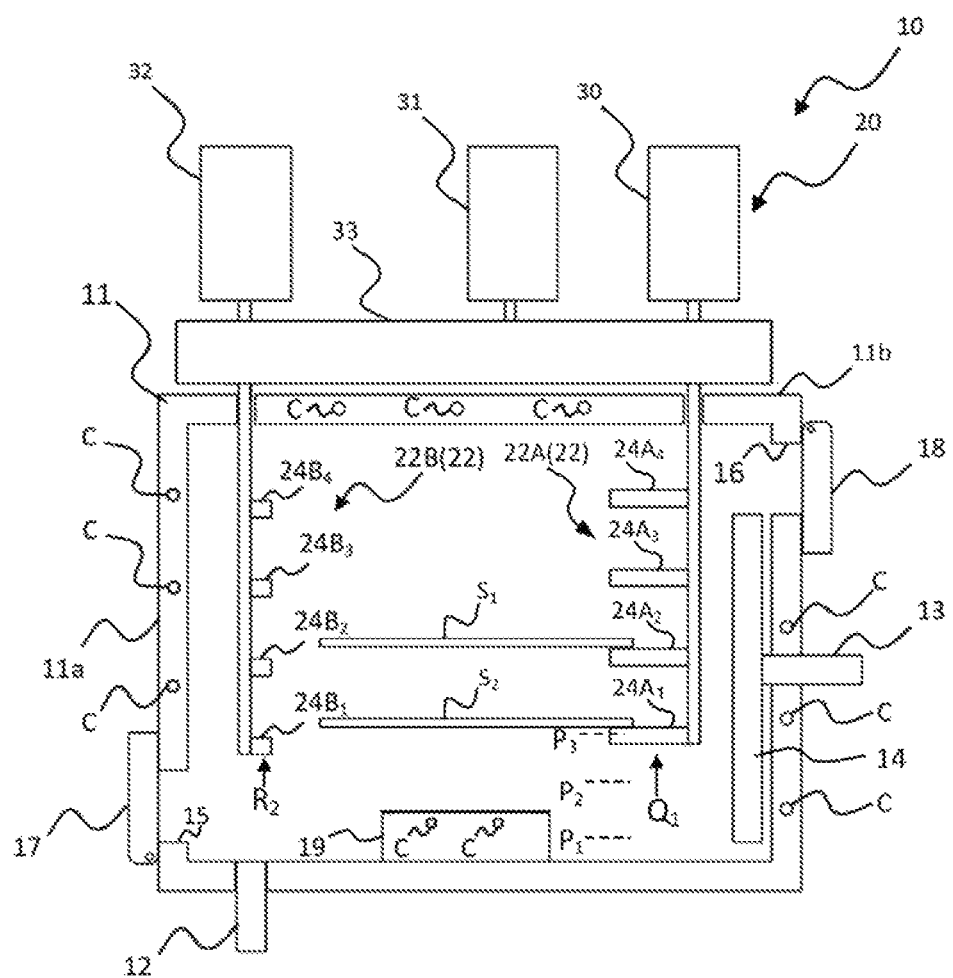

Subsequently, as shown in FIG. 5C, the second retaining body 22B is rotated by the drive source 32 to be set at the retracted position R2, and, after this, as shown in FIG. 5D, the first retaining body 22A is raised by the drive source 30 to the uppermost position P3, that is, until the back surface of the substrate S2 is situated at a position slightly higher than the second support member $24B_1$.

Figure 5E:
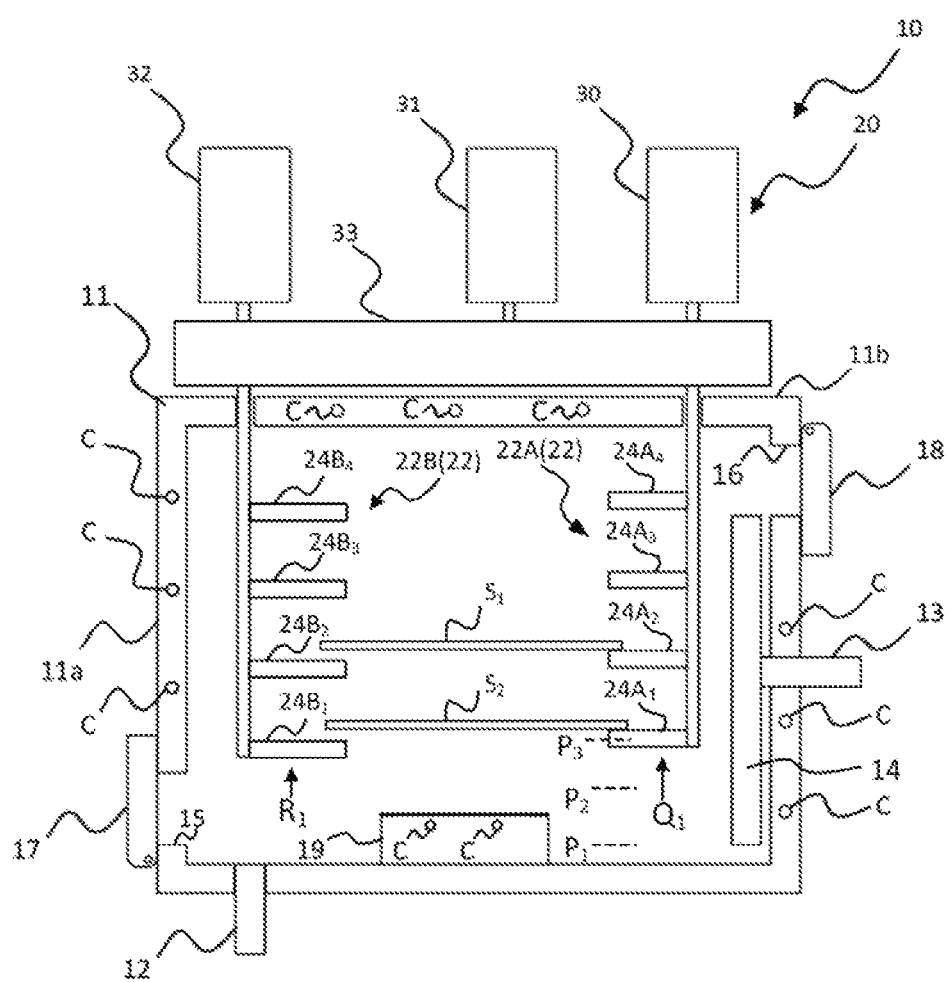
Figure 5F:
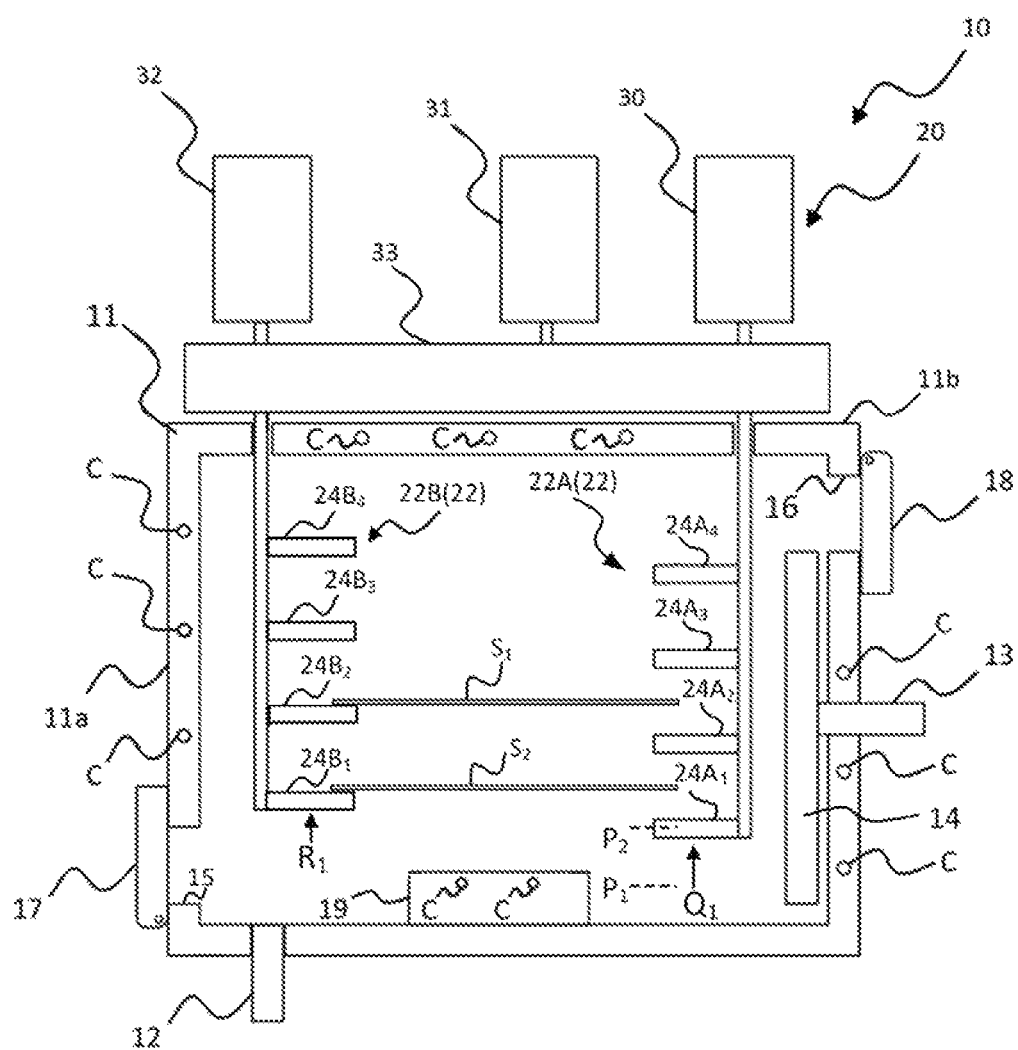

After this, as shown in FIG. 5E, the second retaining body 22B is rotated to the support position R1 by the drive source 32, and, as shown in FIG. 5F, the first retaining body 22A is lowered to the intermediate position P2 by the drive source 30.

In the process of lowering the first retaining body 22A to the intermediate position P2, with the descent of the first retaining body 22A, the substrate S2 also descends. However, since the second retaining body 22B is at the support position R1, halfway through the descent of the first retaining body 22A, the substrate S2 is picked up by the second support member $24B_1$ of the lowermost layer of the second retaining body 22B, and is supported thereby. Thus, the substrate S2 is delivered from the first retaining body 22A to the second retaining body 22B.

At this time, the first substrate S1 is also picked up by the second support member $24B_2$ to be supported thereby, and is delivered from the first retaining body 22A to the second retaining body 22B simultaneously with the second substrate S2.

Figure 5G:
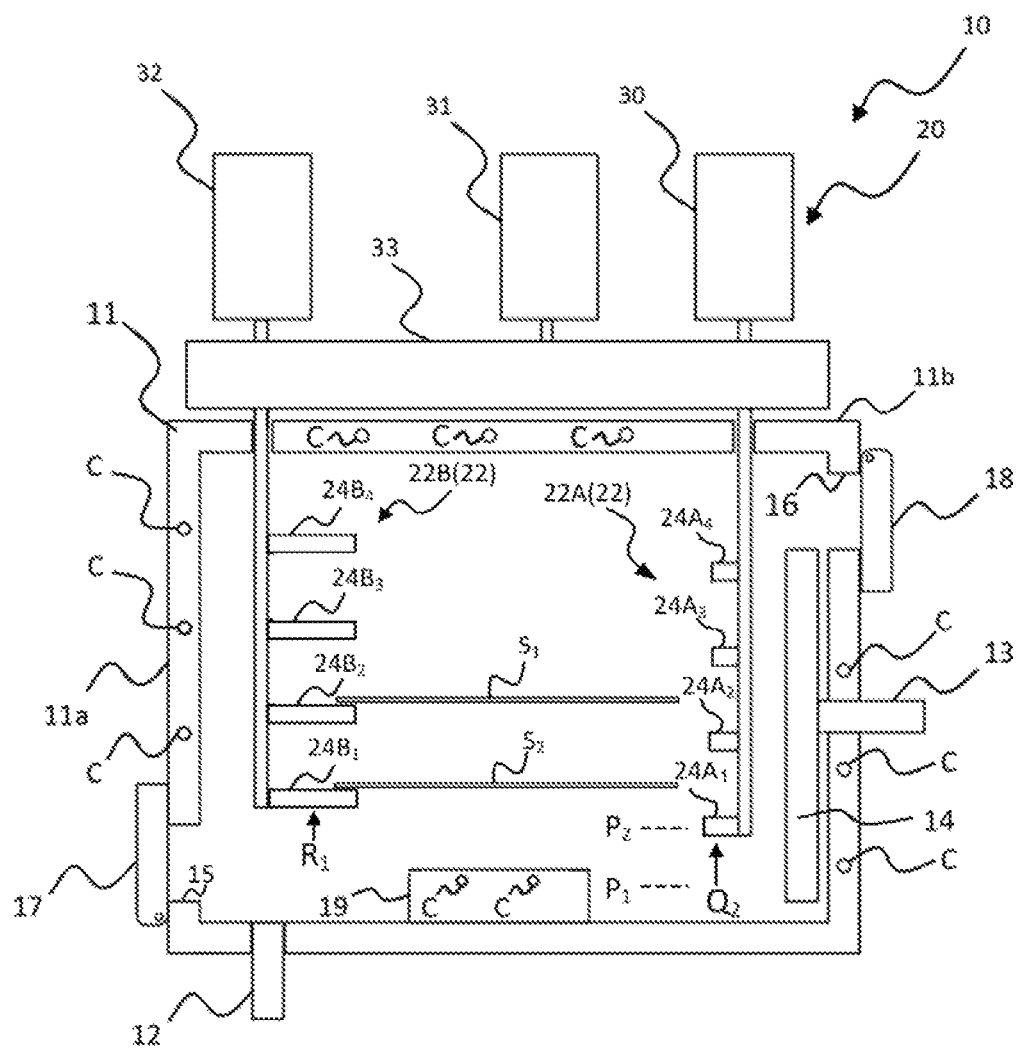
Figure 5H:
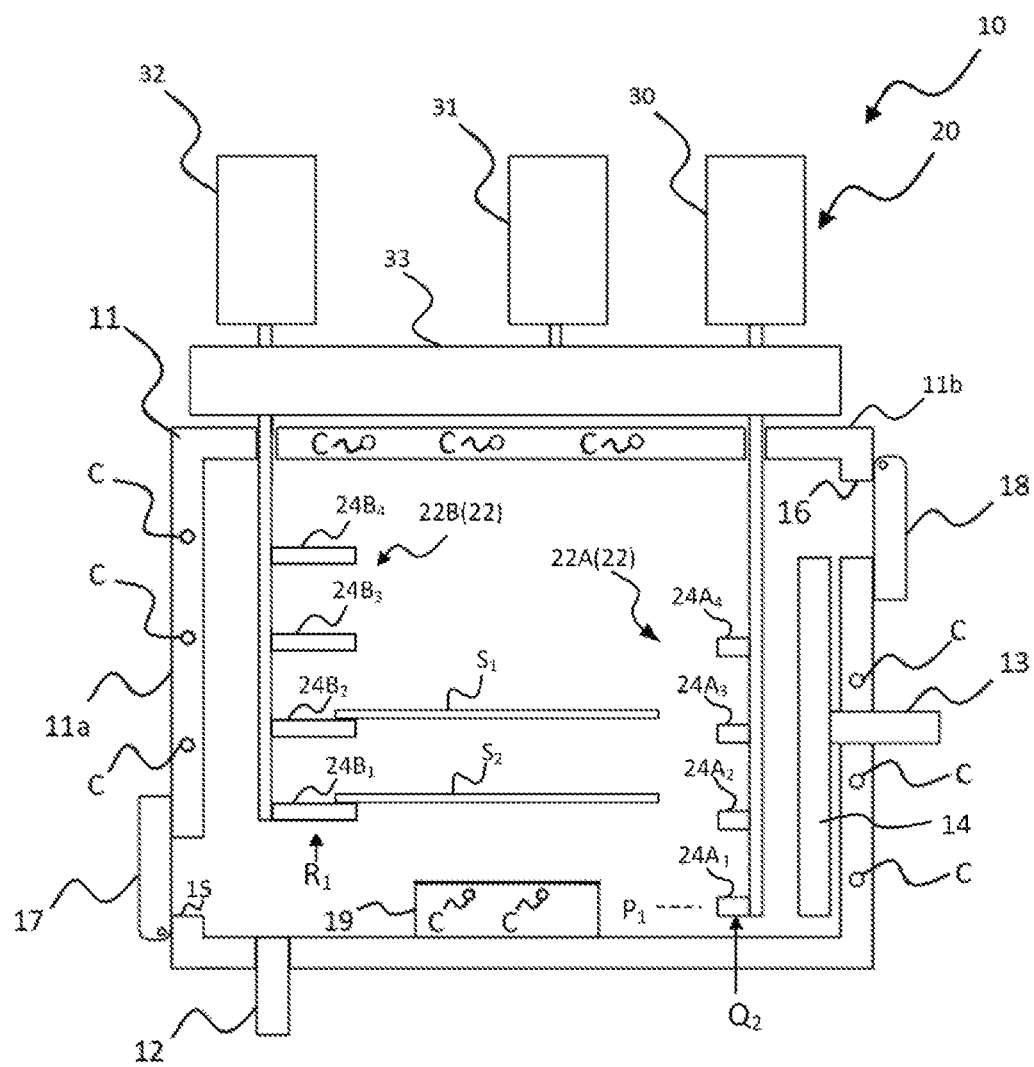
Figure 5I:
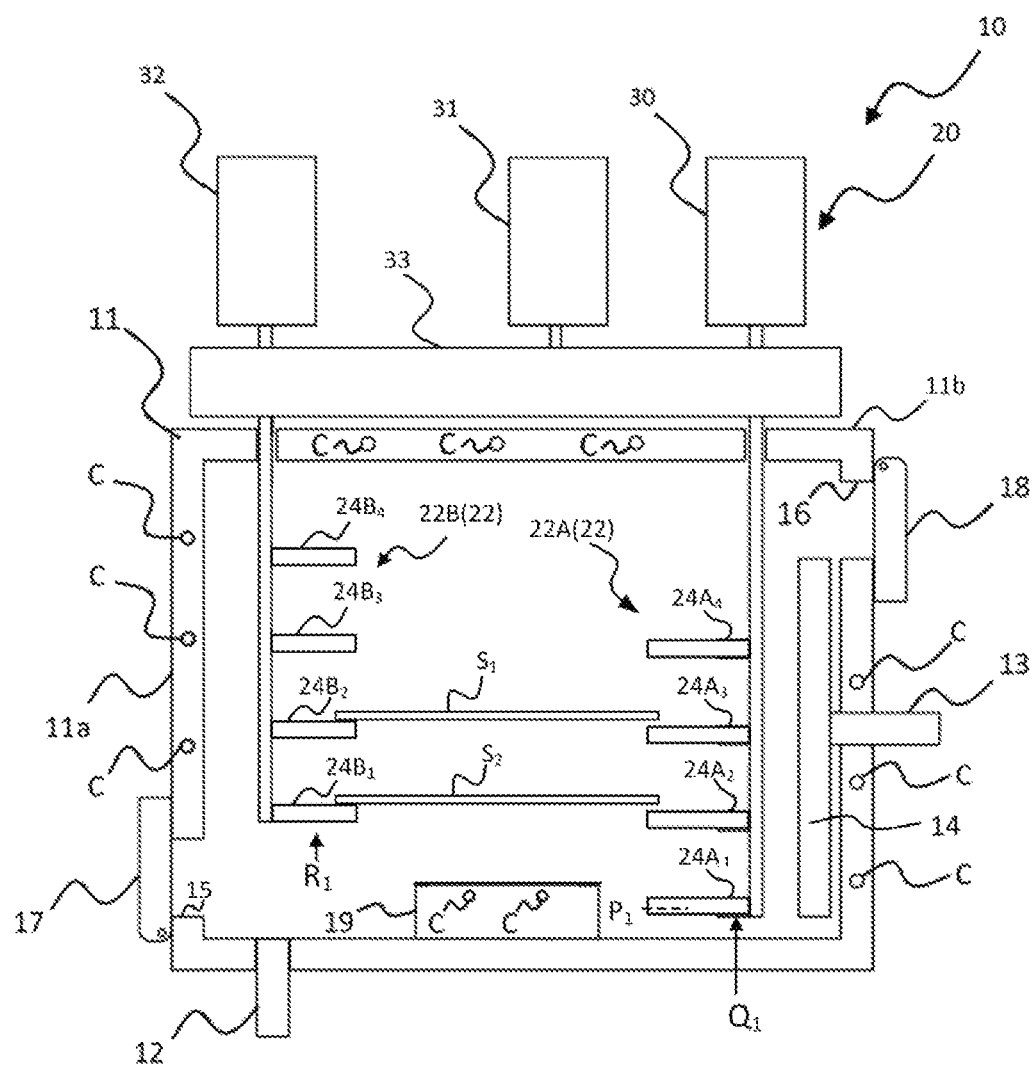

After this, as shown in FIG. 5G, the first retaining body 22A is rotated to the retracted position Q2 by the drive source 31, and, as shown in FIG. 5H, the first retaining body 22A is lowered to the initial position P1 by the drive source 30, and, as shown in FIG. 5I, the first retaining body 22A is rotated to the support position Q1 by the drive source 31.

In this way, simultaneously with the delivery of the substrate S2 from the first retaining body 22A to the second retaining body 22B, the substrate S1 is also delivered from the first retaining body 22A to the second retaining body 22B.

The operation of delivering the second substrate S2 from the first retaining body 22A to the second retaining body 22B will be referred to as the second delivery operation W2.

That is, the second delivery operation W2 refers to the series of operations of, after transferring the second substrate S2 into the casing 11 and placing the second substrate S2 on the stand 19:

(Operation 2-1) raising the first retaining body 22A to the intermediate position P2 by the drive source 30;

(Operation 2-2) rotating the second retaining body 22B to the retracted position R2 by the drive source 32;

(Operation 2-3) raising the first retaining body 22A to the uppermost position P3 by the drive source 30;

(Operation 2-4) rotating the second retaining body 22B to the support position R1 by the drive source 32;

(Operation 2-5) lowering the first retaining body 22A to the intermediate position P2 by the drive source 30;

(Operation 2-6) rotating the first retaining body 22A to the retracted position Q2 by the drive source 31;

(Operation 2-7) lowering the first retaining body 22A to the initial position P1 by the drive source 30; and (Operation 2-8) rotating the first retaining body 22A to the support position Q1 by the drive source 31.

Figure 6A:
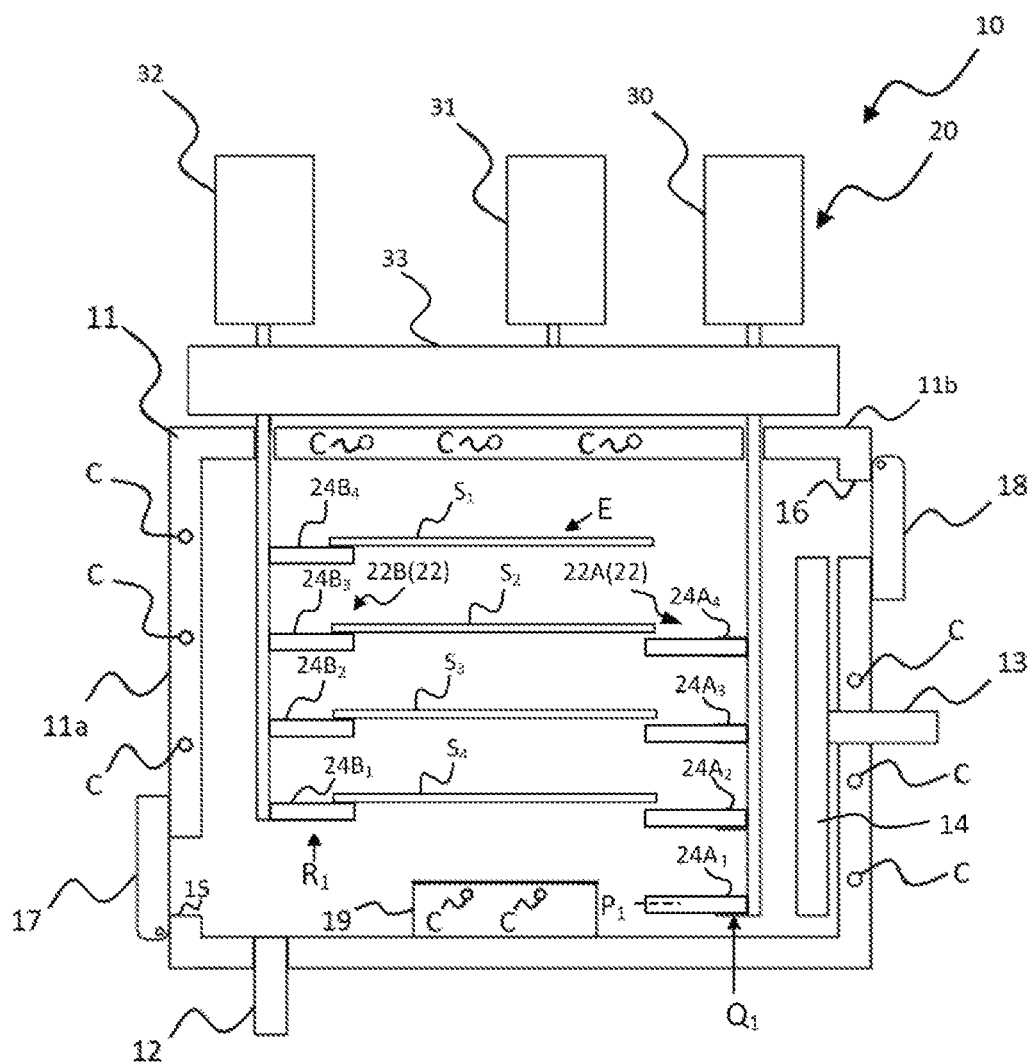
FIGS. 6A-6B are schematic diagrams illustrating a state in which a substrate has reached a carry-out position in the substrate accommodation device of FIG. 1, according to an embodiment.

Subsequently, after placing the third substrate S3 on the stand 19, the second delivery operation W2 (operations 2-1 through 2-8) is performed, and, further, after placing the fourth substrate S4 on the stand 19, the second delivery operation W2 (operations 2-1 through 2-8) is performed, whereby, as shown in FIG. 6A, the first substrate S1 may be supported by the three second support members $24B_4$, situated uppermost, of the second retaining body 22B. The position of the substrate S supported by the three second support members $24B_4$ is the carry-out position E. That is, as noted above, while FIGS. 4A-4D and FIGS. 5A-5I and FIGS. 6A-6B only illustrate only one each of the first retaining body 22A and the second retaining body 22B for conciseness and clarity of description, in an actual implementation, the three second support members 24Bx perform the same operation simultaneously, and the three first support members 24Ax perform the same operation simultaneously such that as a substrate moves up within the casing 11 the substrate is always supported at three points on a back surface thereof.

The first substrate S1 having reached the carry-out position E is transferred out of the casing 11 by the robot hand (not shown) or the like.

After this, after placing the fifth substrate S5 on the stand 19, the second delivery operation W2 is performed, whereby the second substrate S2 is situated at the carry-out position E, and is transferred out of the casing 11.

Accordingly, a next substrate S is transferred into the casing 11 then placed on the stand 19, and the second delivery operation W2 is repeatedly performed, whereby the carrying-in and carrying-out of the substrate S is repeated in a state in which four substrates S are constantly retained by the second retaining body 22B in the casing 11.

At this time, all the substrates S accommodated in the casing 11 solely move up and down in the casing 11 along the height direction, and are delivered so as to be placed on the first support members $24A_1$ to $24A_2$ or on the second support members $24B_1$ to $24B_2$.

Thus, at the time of substrate S delivery operation between the first retaining body 22A and the second retaining body 22B, there is no fear of generation of rubbing between the first retaining body 22A or the second retaining body 22B and the back surface of the substrates S due to rotation of the substrates S or the like, and the substrates S are not flawed.

Next, the method of using the substrate accommodation device 10 will be described.

The substrate accommodation device 10 may be used, in particular, when accommodating the substrates S such as high temperature semiconductor wafers or glass substrates.

As shown in FIG. 4A, after performing processing such as ion implantation on the substrate S1 heated to high temperature, the substrate S1 is transferred into the internally evacuated casing 11 and placed on the stand 19, and then the carry-in gate 17 is closed and nitrogen gas is introduced by the gas supply means 13, whereby the air pressure inside the casing 11 is increased, and the substrate S1 is restored to the atmospheric pressure state.

At this time, in order to cool the substrate S1, the nitrogen gas is introduced into the casing 11 at a temperature lower than a temperature of the substrate S1 in the high temperature state immediately after the processing.

After this, the first delivery operation W1 is performed, and, after supporting the substrate S1 by the second retaining body 22B as shown in FIG. 4D, the gas in the casing 11 is evacuated by using the exhaust means 12 to place the casing 11 into the vacuum state.

Subsequently, the carry-in gate 17 is opened and, as shown in FIG. 5A, the high temperature substrate S2 having undergone processing such as ion implantation is transferred into the casing 11, placed on the stand 19, and the carry-in gate 17 is closed and the casing 11 is restored to the atmospheric pressure by the gas supply means 13, and then the second delivery operation W2 is performed, and, as shown in FIG. 5I, both the substrate S1 and the substrate S2 are supported by the second retaining body 22B before effecting evacuation by the exhaust means 12 to return to the vacuum state.

After this, similar processing is repeated, and, as shown in FIG. 6A, after the substrate S1 has reached the carry-out position E, the carry-out gate 18 is opened and the substrate S1 is transferred out to the exterior of the casing 11 via the carry-out portion 16.

Figure 6B:
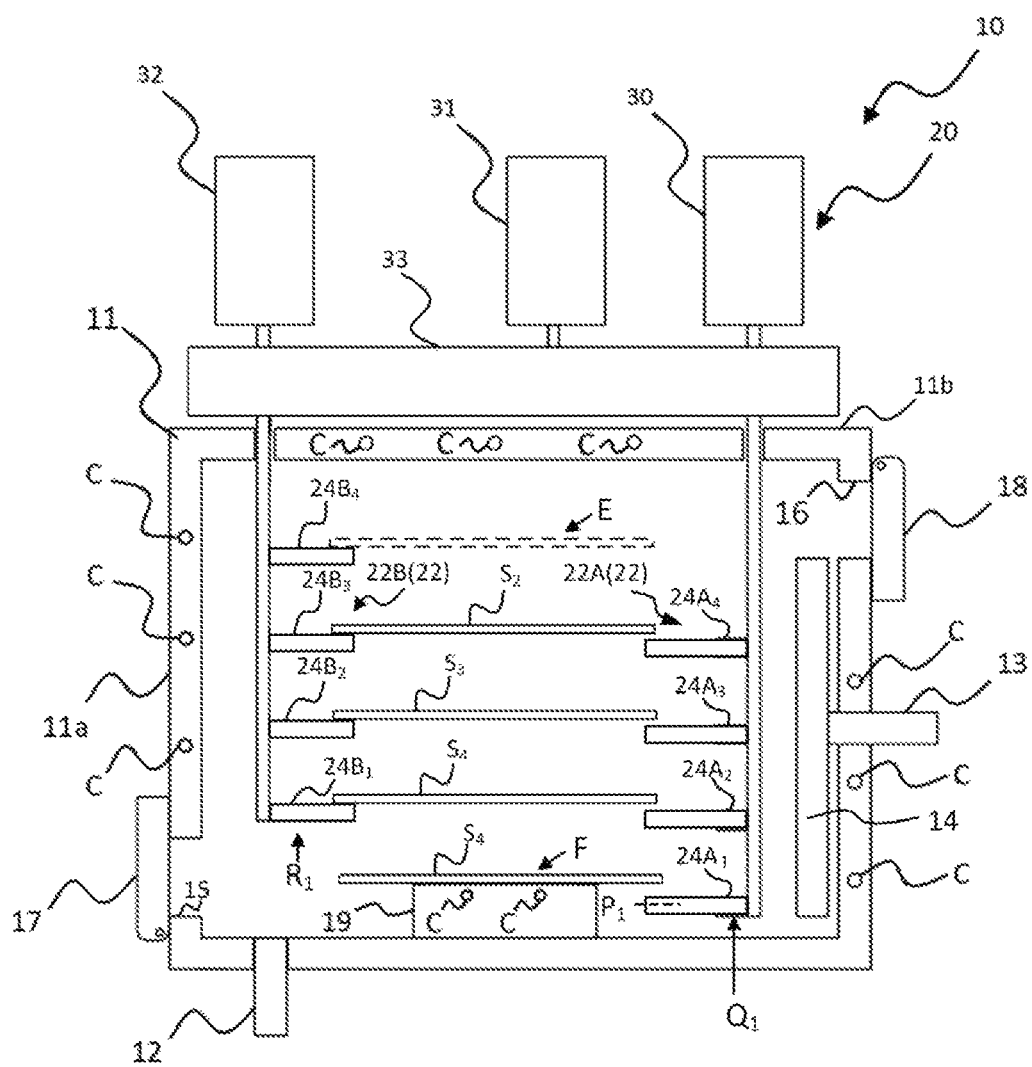

After the first substrate S1 shown in FIG. 6B has been transferred out to the exterior of the casing 11 and the carry-out gate 18 has been closed again, there are repeated the following series of operations:

(Processing 1) transferring a newly processed high temperature substrate S into the casing 11 and placing the substrate S on the stand 19;

(Processing 2) restoring the casing 11 to the atmospheric pressure by the gas supply means 13;

(Processing 3) performing the second delivery operation W2;

(Processing 4) transferring out the substrate S having reached the carry-out position E to the exterior of the casing 11; and (Processing 5) evacuating the casing 11 by using the exhaust means 12;

and the substrates S having reached the carry-out position E are successively transferred out to the exterior of the casing 11.

Thus, in the substrate accommodation device 10 according to various embodiments, processing 1 through 5 is repeated, whereby the substrates S accommodated in the casing 11 move upwards stepwise inside the casing 11, and are successively transferred from the carry-in position F to the carry-out position E in a first-in-first-out manner.

That is, in the process in which processing 1 through 4 is repeated, the requisite time for cooling the substrates S is secured, and the substrates S are cooled to a desired temperature.

In particular, the substrate S is cooled by the nitrogen gas supplied by the gas supply means 13 in the process in which the casing 11 is restored to the atmospheric pressure (processing 2). While the substrate S is transferred from the carry-in position F to the carry-out position E, the substrate S undergoes a plurality of times the process in which the nitrogen gas is introduced (processing 2), so that the substrate S is cooled more effectively.

In the substrate accommodation device 10 according to various embodiments, after a plurality of high temperature substrates S are accommodated in the casing 11, that is, for example after four substrates S are retained by the second retaining body 22B, each time processing 1 through 5 is performed, the substrates S are transferred out one by one to the exterior of the casing 11 in the cooled state.

Thus, the substrate accommodation device 10 repeats the operation of transferring out the substrate S having reached the carry-out position E after performing processing 1 through 5, whereby, each time a high temperature substrate S is newly transferred into the casing 11 from the vacuum processing chamber 100, the substrate accommodation device 10 may transfer out the cooled substrates S one by one to the exterior of the casing 11.

That is, in the substrate accommodation device 10, as one high temperature substrate S is newly accommodated, one cooled substrate S is transferred out, so that there is substantially no need for a standby time for cooling, making it possible to secure high throughput.

Further, the substrate accommodation device 10 according to various embodiments is equipped with a diffusion filter 14, so that it is possible to distribute the nitrogen gas among a plurality of substrates S, making it possible to cool each of the substrates S effectively and uniformly.

Further, by causing a refrigerant such as cooling water to flow through the flow path C, it is possible to cool the nitrogen gas, the temperature of which has been raised by taking heat from the substrates S, so that it is possible to cool the substrates S more effectively.

It should be noted that there is no need to cause the refrigerant to flow through the flow path C so long as it is possible to cool the substrates S to a desired temperature in a desired cooling time by solely using the gas such as nitrogen gas introduced by the gas supply means 13. Accordingly, in some embodiments, the flow path C may be omitted.

Further, by changing or adjusting the number of substrates that may be accommodated in the substrate accommodation device 10, the requisite time for transferring the substrate S from the carry-in position F to the carry-out position E, the time it takes to introduce the gas into the casing 11 from the gas supply means 13, or the temperature of the introduced gas itself, it is possible to change the requisite time for cooling one substrate S to a desired temperature, that is, the requisite time for one substrate S introduced into the casing 11 to be transferred out.

Note that in the substrate accommodation device 10 according to various embodiments, in order to cool the substrates S accommodated in the casing 11, the gas introduced into the substrate accommodation device 10 by the gas supply means 13 may be set to a lower temperature than a temperature of the substrates S in the high temperature state.

Further, a refrigerant may be caused to flow through the flow path C in order to cool the gas, the temperature of which has been increased by taking heat from the substrates S after introduction of the gas into the casing 11 by the gas supply means 13, and to lower the temperature of the atmosphere within the casing 11.

The above description takes as an example a case of cooling the substrates S. In contrast, in the case where the substrates S are heated by using the substrate accommodation device 10, a change may be effected such that a high temperature heat exchange medium flows through the flow path C, and the gas introduced by the gas supply means 13 is set to a temperature higher than that of a temperature of the substrates S in the low temperature state before they are accommodated in the casing 11. In this case also, there is no need to change the transfer structure 20, and the method of transferring the substrates S from the carry-in position F to the carry-out position E by the transfer structure 20.

Thus, as one low temperature substrate S is newly accommodated in the casing 11, one heated substrate S is transferred out, so that there is substantially no need for the standby time for heating the substrates, making it possible to secure high throughput.

Note that, if the substrates S are heated to a desired temperature solely by the high temperature gas introduced by the gas supply means 13, there is no need to cause a high temperature heat exchange medium to flow through the flow path C. Thus, in some embodiments, the flow path C may be omitted in the case of the substrate accommodation device that provides heating.

While the substrate accommodation device 10 according to various embodiments is applicable for both the cooling and heating of a plurality of substrates S, in some embodiments, the substrate accommodation device may also be applicable to solely one of the cooling and heating of a plurality of substrates S.

Further, while in the substrate accommodation device 10 is illustrated as being arranged adjacent to the vacuum processing chamber 100 through the intermediation of the carry-in portion 15 of the casing 11, the adjacent configuration only shows a use example in the case where the substrates S having undergone processing such as ion implantation are transferred in. However, embodiments are not limited thereto and the substrate accommodation device 10 may be arranged in a different position with respect to a processing chamber.

For example, it is also possible to arrange the substrate accommodation device 10 adjacent to the vacuum processing chamber 100 through the intermediation of the carry-out portion 16 of the casing 11, and to transfer out the substrates S to the vacuum processing chamber 100.

Further, the substrate accommodation device 10 is not restricted to the structure in which it is arranged adjacent to the vacuum processing chamber 100. For example, a conveyance chamber may be provided between the vacuum processing chamber 100 and the substrate accommodation device 10, and the substrates S may be transferred into the substrate accommodation device 10 or transferred out of the substrate accommodation device 10 via the conveyance chamber.

Further, while in the embodiment illustrated in FIGS. 1-6B, the transfer structure 20 is operated so as to upwardly transfer a plurality of substrates S, in other embodiments, a transfer structure may be operated so as to downwardly transfer a plurality of substrates S. That is, even in the case where the carry-out position E of the casing 11 is provided lower than the carry-in position F, it is possible to transfer a plurality of substrates S successively downwards from the carry-in position F to the carry-out position E by using the transfer structure 20.

Next, a substrate accommodation device 50 according to an embodiment will be described.

Figure 9:
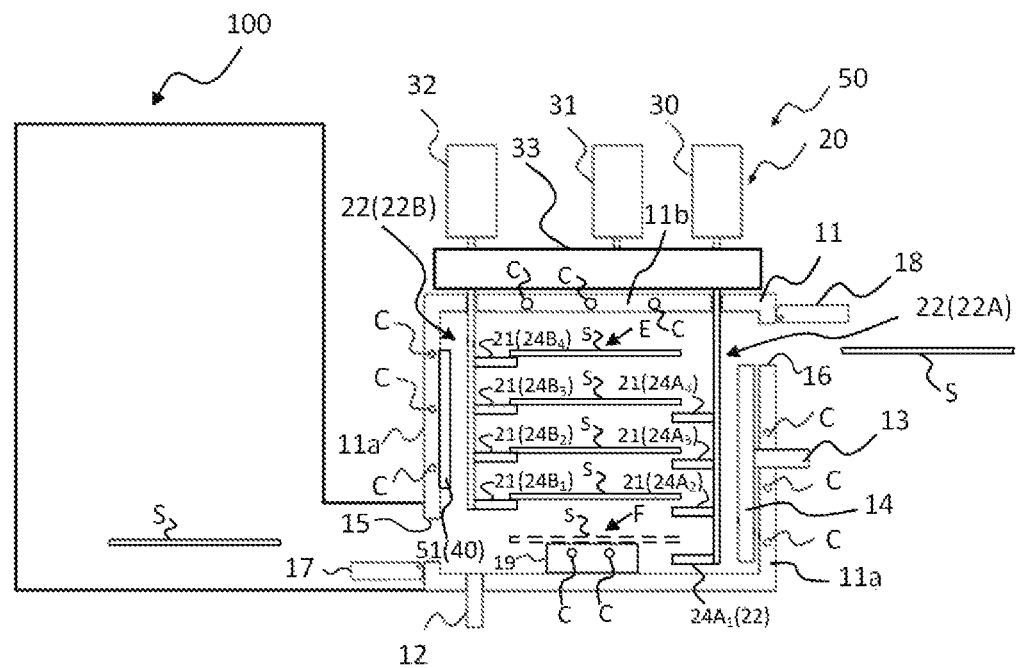
FIG. 9 is a schematic view of a structure of a substrate accommodation device according to an embodiment.

As shown in FIG. 9, in addition to the structure of the substrate accommodation device 10 illustrated in FIGS. 1-6B, in some embodiments, the substrate accommodation device 50 may be equipped with a heat source 51 at a side surface portion 11a of the casing 11. For example, a heating lamp may be employed as the heat source 51.

In the substrate accommodation device 50, the heat source 51 may constitute a temperature varying means 40. Further, in the case where a gas such as nitrogen gas at a temperature higher than that of the substrates S immediately after being transferred into the casing 11 is introduced from the gas supply means 13, the gas supply means 13 may also constitute the temperature varying means in addition to the heat source 51.

Note that the gas introduced from the gas supply means 13 is not restricted to a gas expected to heat the substrates S. For example, the gas may be a gas having the function of only the atmospheric pressure restoration gas in the case where the substrate accommodation device 50 is used as the load lock device.

Regarding the other structure and function, the other structures and functions of the substrate accommodation device 50 are the same as those of the substrate accommodation device 10 described above, so a repeated description thereof will be omitted for conciseness.

Connected to the heat source 51 may be a power source (not shown) and a switch, and by controlling the turning ON/OFF of the switch from the outside, the power supply to the heat source 51 is ON/OFF-controlled.

The substrate accommodation device 50 may perform control to constantly operate the heat source 51, or may perform control to repeat an operation of a predetermined time in accordance with the conveyance of the substrates S, whereby it is possible to heat the substrates S accommodated in the casing 11.

Also in the substrate accommodation device 50, as one low temperature substrate S is newly accommodated in the casing 11, one heated substrate S may be transferred out, so that there is substantially no need to provide standby time for heating, making it possible to secure high throughput.

While the substrate accommodation device 50 is arranged adjacent to the vacuum processing chamber 100, embodiments are not limited thereto. While the substrate accommodation device 50 heats the substrates S transferred in from the vacuum processing chamber 100, in some embodiments it is possible to transfer out the substrates S heated by the substrate accommodation device 50 to the vacuum processing chamber 100.

Further, when the function of a load lock device is not needed, the substrate accommodation device 50 may omit the exhaust means 12, the gas supply means 13, and the diffusion filter 14, and may omit the flow path C.

Next, a specific example of the arrangement of the substrate accommodation device 10 or of the substrate accommodation device 50 will be described.

Figure 10:
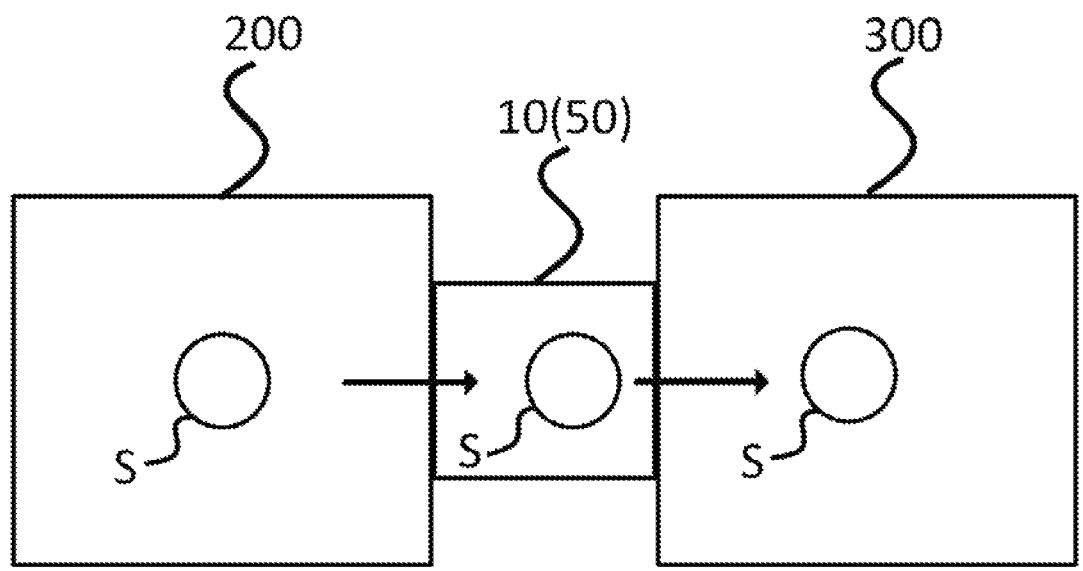
FIG. 10 is a schematic diagram illustrating an arrangement example of a substrate accommodation device according to an embodiment.

As shown in FIG. 10, the substrate accommodation device 10 or the substrate accommodation device 50 may be arranged between a so-called sheet-fed type vacuum processing chamber 200 and sheet-fed type vacuum processing chamber 300 each of which processes the substrates S one by one, and the substrate accommodation device 10 or the substrate accommodation device 50 may perform the transfer of the substrates S.

In this case, while accommodating the substrates S having undergone processing one by one in the vacuum processing chamber 200 successively in the casing 11, and while maintaining the state in which a predetermined number of substrates S are accommodated in the casing 11, the substrate accommodation device 10 or the substrate accommodation device 50 may transfer the cooled or heated substrates S one by one into the vacuum processing chamber 300.

Thus, in the case where the substrate accommodation device 10 or the substrate accommodation device 50 is arranged between the sheet-fed type vacuum processing chambers 200 and 300, as one substrate S is transferred in from the vacuum processing chamber 200, one substrate S that has been cooled or heated to a desired temperature may be successively transferred out to the vacuum processing chamber 300.

That is, there is substantially no need for standby time for collectively cooling or heating a plurality of substrates S, and it is possible to secure high throughput without having to cool or heat a plurality of substrates S collectively and abruptly.

In more detail, the transfer structure 20 is configured or controlled such that the number of substrates processed by the substrate processing chamber 200 per unit time and the number of substrates transferred out by the substrate accommodation device 10 or the substrate accommodation device 50 per unit time coincide with each other, whereby in the substrate accommodation device 10 or the substrate accommodation device 50, it is possible to transfer out the substrates S into the vacuum processing chamber 300 in a state in which the standby time for cooling or heating the substrates S transferred in from the vacuum processing chamber 200 is substantially eliminated, making it possible to secure high throughput.

In the following, a modification of the retaining portion 21 of the transfer structure 20 will be described.

Figure 7:
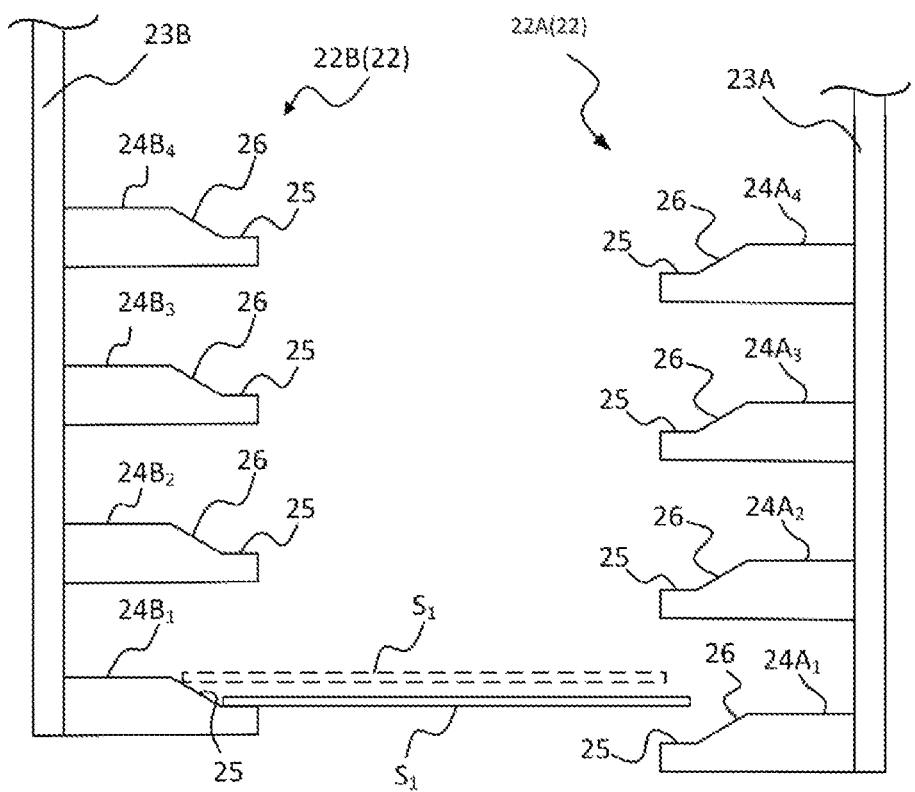
FIGS. 7-8 are schematic diagrams illustrating modifications of a retaining portion of the substrate accommodation device of FIG. 1, according to embodiments.
Figure 8:
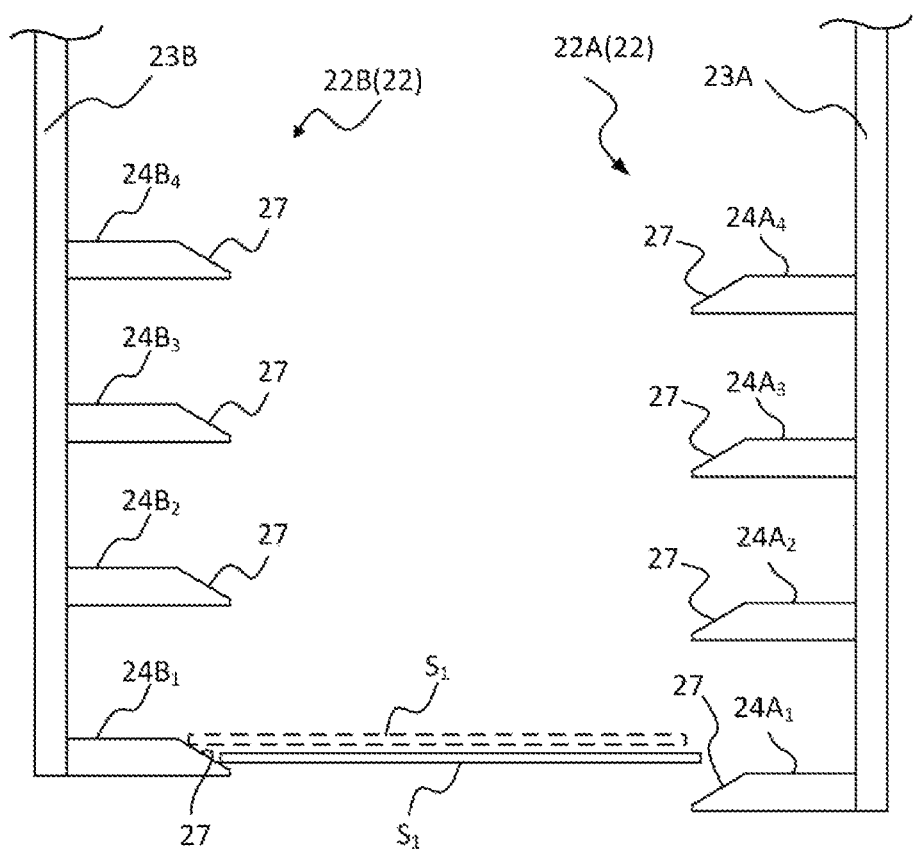

FIGS. 7-8 are schematic diagrams illustrating modifications of a retaining portion of the substrate accommodation device of FIG. 1, according to embodiments.

As shown in FIG. 7, the first support members $24A_1$ through $24A_4$ which are the retaining portions 21 of the first retaining body 22A, and the second support members $24B_1$ through $24B_4$ which are the retaining portions 21 of the second retaining body 22B may be formed so as to be equipped with a planar support portion 25 supporting an outer edge portion of the back surface of the substrate S, and a tapered guide portion 26 connected with the planar support portion 25 and configured to attract the substrate S to the planar support portion 25. In other words, the outer edge portion of the back surface of the substrate S may first contact the tapered guide portion 26 and slide down to the planar support portion 25.

In this case, when the substrate S is picked up from the stand 19, or when it is delivered between the first retaining body 22A and the second retaining body 22B, even in the case where a deviation from a predetermined position is generated, the substrate S is attracted to the support portion 25 by the guide portion 26, and the positional deviation may be corrected.

Further, as shown in FIG. 8, the first support members $24A_1$ through $24A_4$ and the second support members $24B_1$ through $24B_4$ may be formed so as to be equipped with a tapered guide support portion 27 supporting the end edge portion of the back surface of the substrate S.

In this case, when the substrate S is picked up from the stand 19, or when it is delivered between the first retaining body 22A and the second retaining body 22B, even in the case where a deviation from a predetermined position is generated, the substrate S is attracted to a predetermined position by the guide support portion 27, and the positional deviation may be corrected, and the substrate S is supported.

It should be understood that the present disclosure is not limited to the above embodiments, but various other changes and modifications may be made therein without departing from the spirit and scope thereof as set forth in appended claims.

What is claimed is:

1. A substrate accommodation device comprising:
   a casing that accommodates a plurality of substrates;

a temperature varying means for varying a temperature of the substrates accommodated in the casing; and
a transfer structure which retains the plurality of substrates accommodated in the casing in a state in which the substrates are spaced apart from each other at a predetermined interval and which, within the casing, transfers the substrates from a carry-in position at which the substrates are transferred into the casing from an outside of the casing to a carry-out position from which the substrates are transferred to the outside of the casing,
wherein the transfer structure is configured such that, as substrates are newly accommodated in the casing, substrates previously accommodated in the casing are successively transferred to the carry-out position,
wherein the transfer structure simultaneously transfers the plurality of substrates in the casing by driving a retaining body comprising a plurality of retaining portions that respectively retain the plurality of substrates, and
wherein the retaining body comprises a first retaining body and a second retaining body, the first retaining body being driven independently from the second retaining body, and the retaining body transfers the substrates from the carry-in position to the carry-out position within the casing while simultaneously repeating an operation of delivering each of the plurality of substrates between a first retaining portion which is a retaining portion of the first retaining body and a second retaining portion which is a retaining portion of the second retaining body by respectively and alternately driving the first retaining body and the second retaining body.

2. The substrate accommodation device according to claim 1, further comprising:
an exhaust means for evacuating the casing; and
a gas supply means for introducing a gas into the casing, wherein the gas supply means functions as the temperature varying means.

3. A substrate accommodation device comprising:
a casing that accommodates a plurality of substrates;
a temperature varying means for varying a temperature of the substrates accommodated in the casing; and
a transfer structure which retains the plurality of substrates accommodated in the casing in a state in which the substrates are spaced apart from each other at a predetermined interval and which, within the casing, transfers the substrates from a carry-in position at which the substrates are transferred into the casing from an outside of the casing to a carry-out position from which the substrates are transferred to the outside of the casing,
wherein the transfer structure comprises a first retaining body and a second retaining body and is configured such that, as substrates are newly accommodated in the casing, substrates previously accommodated in the casing are successively transferred to the carry-out position, and
wherein the first retaining body comprises a plurality of first retaining bodies and the second retaining body comprises a plurality of second retaining bodies, and the plurality of first retaining bodies are driven to perform an identical operation in conjunction with each other, and the plurality of second retaining bodies are driven to perform an identical operation in conjunction with each other.

4. A substrate accommodation device comprising:
a casing that accommodates a plurality of substrates;
a gas supply that supplies a gas having a temperature into the casing to heat or cool the substrates; and
a transfer structure which retains the plurality of substrates accommodated in the casing in a state in which the substrates are spaced apart from each other at a predetermined interval and which, within the casing, transfers each substrate of the plurality of substrates from a carry-in position at which the substrate is transferred into the casing from an outside of the casing to a carry-out position from which the substrate is transferred to the outside of the casing,
wherein the transfer structure is configured such that, as a new substrate is transferred into the casing, substrates previously accommodated in the casing are successively transferred to the carry-out position,
wherein the transfer structure comprises:
a plurality of drive sources;
a plurality of retaining bodies that extend within the casing and are configured to support the plurality of substrates; and
a drive transfer device that transfers a drive force from the plurality of drive sources to the plurality of retaining bodies,
wherein the plurality of retaining bodies comprise a plurality of first retaining bodies and a plurality of second retaining bodies, wherein the plurality of first retaining bodies are connected to a first drive source of the plurality of drive sources that rotates the plurality of first retaining bodies and to a second drive source of the plurality of drive sources that raises and lowers the plurality of first retaining bodies, and the plurality of second retaining bodies are connected to a third drive source of the plurality of drive sources that rotates the plurality of second retaining bodies, and
wherein each of the plurality of first retaining bodies and each of the plurality of second retaining bodies is rotatable between a support position that supports the substrates and a retracted position that does not support the substrates.

5. The substrate accommodation device of claim 4, wherein the carry-out position is vertically above the carry-in position.

6. The substrate accommodation device of claim 5, wherein a new substrate of the plurality of substrates is transferred into the casing, the substrates previously accommodated in the casing are successively transferred vertically up the transfer structure from the carry-in position to the carry-out position, in a first in first out configuration.

7. The substrate accommodation device of claim 4, wherein the carry-out position is vertically below the carry-in position.

8. The substrate accommodation device of claim 4, further comprising:
an exhaust port through which the casing is evacuated to generate a vacuum state within the casing.

9. A substrate accommodation device comprising:
a casing;
a gas supply that supplies a gas into the casing; and
a transfer structure which retains a plurality of substrates vertically spaced apart from each other and vertically transfers the plurality of substrates first-in-first-out from a carry-in position to a carry-out position within the casing,
wherein the substrates are transferred from an outside the casing to the carry-in position through a first side of the casing, and transferred from the casing to the outside of the casing through a second side of the casing opposite to the first side, and wherein the gas heats or cools the substrates as the substrates are transferred first-in-first-out from the carry-in position to the carry-out position, wherein the carry-in position is located at a bottom of the casing and the carry-out position is located at a top of the casing, and the carry-out position is directly vertically above the carry-in position, wherein the transfer structure comprises:

a plurality of drive sources;

a plurality of retaining bodies that extend within the casing and are configured to support the plurality of substrates; and a drive transfer device that transfers a drive force from the plurality of drive sources to the plurality of retaining bodies, wherein the plurality of retaining bodies comprise a plurality of first retaining bodies and a plurality of second retaining bodies, wherein the plurality of first retaining bodies are connected to a first drive source of the plurality of drive sources that rotates the plurality of first retaining bodies and to a second drive source of the plurality of drive sources that raises and lowers the plurality of first retaining bodies, and the plurality of second retaining bodies are connected to a third drive source of the plurality of drive sources that rotates the plurality of second retaining bodies, and wherein each of the plurality of first retaining bodies and each of the plurality of second retaining bodies is rotatable between a support position that supports the substrates and a retracted position that does not support the substrates.

10. The substrate accommodation device of claim 9, further comprising:

an exhaust port through which the casing is evacuated to generate a vacuum state within the casing.

* * * * *